(12) United States Patent
Ito et al.

(10) Patent No.: US 10,403,505 B2
(45) Date of Patent: Sep. 3, 2019

(54) SUBSTRATE PROCESSING METHOD AND SUBSTRATE PROCESSING APPARATUS

(71) Applicant: EBARA CORPORATION, Tokyo (JP)

(72) Inventors: Kenya Ito, Tokyo (JP); Masaya Seki, Tokyo (JP); Kenichi Kobayashi, Tokyo (JP); Michiyoshi Yamashita, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/701,206

(22) Filed: Sep. 11, 2017

(65) Prior Publication Data

US 2018/0076043 A1    Mar. 15, 2018

Related U.S. Application Data

(60) Provisional application No. 62/395,068, filed on Sep. 15, 2016.

(51) Int. Cl.

| | |
|---|---|
| *H01L 21/304* | (2006.01) |
| *B23K 26/08* | (2014.01) |
| *B24B 37/00* | (2012.01) |
| *H01L 21/02* | (2006.01) |
| *H01L 21/67* | (2006.01) |
| *B24B 21/00* | (2006.01) |
| *B24B 21/08* | (2006.01) |

(Continued)

(52) U.S. Cl.
CPC ...... *H01L 21/3043* (2013.01); *B23K 26/0823* (2013.01); *B24B 9/065* (2013.01); *B24B 21/002* (2013.01); *B24B 21/004* (2013.01); *B24B 21/08* (2013.01); *B24B 37/00* (2013.01); *H01L 21/02021* (2013.01); *H01L 21/304* (2013.01); *H01L 21/67138* (2013.01); *B23K 2101/40* (2018.08)

(58) Field of Classification Search
CPC .......... H01L 21/3043; H01L 21/67138; H01L 21/02021; H01L 21/304; B24B 21/002; B24B 9/065; B24B 21/08; B24B 21/004; B24B 37/00; B23K 26/0823; B23K 2101/40
See application file for complete search history.

(56) References Cited

U.S. PATENT DOCUMENTS

| 7,601,051 B2 * | 10/2009 | Tanaka ..................... B24D 7/06 451/285 |
|---|---|---|
| 7,677,955 B2 * | 3/2010 | Kajiyama ................. B24B 1/00 451/11 |

(Continued)

FOREIGN PATENT DOCUMENTS

| JP | 2005-093882 A | 4/2005 |
|---|---|---|
| JP | 2012-038896 A | 2/2012 |
| JP | 2013-089713 A | 5/2013 |

*Primary Examiner* — John P. Dulka
(74) *Attorney, Agent, or Firm* — Baker & Hostetler LLP

(57) ABSTRACT

A method and an apparatus for processing a peripheral portion of a substrate, such as a wafer, are disclosed. The substrate processing method includes: holding a substrate on a substrate stage; rotating the substrate stage and the substrate about an axis of the substrate stage; directing a laser beam to an edge portion of the rotating substrate to form an annular crack in the substrate; and pressing a polishing tool against the edge portion of the rotating substrate to form a stepped recess in a peripheral portion of the substrate.

11 Claims, 31 Drawing Sheets

(51) Int. Cl.
*B24B 9/06* (2006.01)
*B23K 101/40* (2006.01)

(56) References Cited

U.S. PATENT DOCUMENTS

| | | |
|---|---|---|
| 8,523,636 B2 | 9/2013 | Uchiyama |
| 9,613,795 B2* | 4/2017 | Morikazu ......... H01L 21/02013 |
| 10,081,076 B2* | 9/2018 | Hirata ................ B23K 26/0006 |
| 2004/0152285 A1* | 8/2004 | Konnemann ........... H01L 21/78 |
| | | 438/460 |
| 2006/0079155 A1* | 4/2006 | Nakamura .............. B24B 7/228 |
| | | 451/41 |
| 2010/0255657 A1* | 10/2010 | Priewasser .......... H01L 21/3043 |
| | | 438/462 |
| 2015/0332928 A1* | 11/2015 | Priewasser .......... H01L 21/6836 |
| | | 438/460 |
| 2015/0352669 A1* | 12/2015 | Kondo .............. H01L 21/67115 |
| | | 438/7 |
| 2018/0197825 A1* | 7/2018 | Yoshida ................... H01L 21/78 |
| 2018/0211852 A1* | 7/2018 | Ban ................... H01L 21/67092 |
| 2018/0309018 A1* | 10/2018 | Kirihara ................. H01L 21/78 |
| 2018/0350681 A1* | 12/2018 | Tanaka .................... H01L 21/78 |
| 2019/0155928 A1* | 5/2019 | Baruch ............... G06F 16/2246 |

* cited by examiner

SUBSTRATE PROCESSING METHOD AND SUBSTRATE PROCESSING APPARATUS

CROSS REFERENCE TO RELATED APPLICATION

This application claims priority to U.S. Provisional Patent Application No. 62/395,068 filed Sep. 15, 2016, the entire contents of which are hereby incorporated by reference.

BACKGROUND

Control of a surface condition of a wafer has recently attracted attention from the viewpoint of an increase in a yield in manufacturing of semiconductor devices. In a semiconductor device manufacturing process, films of various materials are formed on a silicon substrate. Therefore, an unnecessary film(s) or surface roughness is formed on a peripheral portion of the substrate. These days it is a common practice to transport a substrate while holding only a peripheral portion of the substrate with arms. With such a background, an unnecessary film, remaining on a peripheral portion of a substrate, may peel off during various processes and may adhere to a device formed on the substrate, resulting in reduced yield. Thus, in order to remove an unnecessary film from the peripheral portion of the substrate, a polishing apparatus is used to polish the peripheral portion of the substrate.

FIG. 45 is a schematic view of a conventional polishing apparatus. A polishing tape 205 for polishing a substrate W is pressed by a pressing member 208 against an edge portion of the substrate W. The pressing member 208 is coupled to an air cylinder 209, and a force that presses the polishing tape 205 against the substrate W is applied from the air cylinder 209 to the pressing member 208.

A peripheral portion of the substrate W is polished in the following manner. While the substrate W is being rotated about its axis, a liquid (e.g., pure water) is supplied onto an upper surface of the substrate W. The air cylinder 209 exerts a pressing force on the pressing member 208, which in turn presses the polishing tape 205 against the edge portion of the substrate W. The polishing tape 205 polishes the peripheral portion, including the edge portion, of the substrate W, thereby forming a stepped recess 210 as shown in FIG. 46 in the peripheral portion of the substrate W.

However, there are several problems in the conventional polishing apparatus. Specifically, a position of the polishing tape 205 is unstable at the beginning of polishing, and a polishing start position may be displaced from a predetermined position. Moreover, as shown in FIG. 47, the recess 210 may have a serrated inside surface, which can cause particles in a subsequent substrate processing.

SUMMARY OF THE INVENTION

According to embodiments of the present invention to be described below, there are provided a substrate processing method and a substrate processing apparatus which are capable of forming a stepped recess highly accurately in a peripheral portion of a substrate.

The embodiments of the present invention, which will to be described below, relate to a method of and an apparatus for processing a peripheral portion of a substrate, and are particularly concerned with a substrate processing method and a substrate processing apparatus for forming a stepped recess in a peripheral portion of a substrate.

In an embodiment, there is provided a substrate processing method comprising: holding a substrate on a substrate stage; rotating the substrate stage and the substrate about an axis of the substrate stage; directing a laser beam to an edge portion of the rotating substrate to form an annular crack in the substrate; and pressing a polishing tool against the edge portion of the rotating substrate to form a stepped recess in a peripheral portion of the substrate.

In an embodiment, directing the laser beam to the edge portion of the rotating substrate to form the annular crack in the substrate comprises directing a laser beam to an edge portion of the rotating substrate in a direction perpendicular to a surface of the substrate to form an annular crack in the substrate.

In an embodiment, directing the laser beam to the edge portion of the rotating substrate to form the annular crack in the substrate comprises directing a laser beam to an edge portion of the rotating substrate in a direction inclined from a direction that is perpendicular to a surface of the substrate to form an annular crack in the substrate.

In an embodiment, there is provided a substrate processing method comprising: holding a substrate on a substrate stage; rotating the substrate stage and the substrate about an axis of the substrate stage; repeating a first irradiation process of directing a laser beam to a peripheral portion of the rotating substrate and a second irradiation process of directing a laser beam to the peripheral portion of the rotating substrate at an angle different from an angle of the laser beam in the first irradiation process, thereby forming a plurality of concentric annular cracks in the peripheral portion of the substrate; and removing a material of the substrate from the peripheral portion of the substrate to form a stepped recess in the peripheral portion of the substrate.

In an embodiment, removing the material of the substrate from the peripheral portion of the substrate comprises pressing a polishing tool against the peripheral portion of the substrate to polish the peripheral portion.

In an embodiment, removing the material of the substrate from the peripheral portion of the substrate comprises attaching an adhesive tape to an entirety of the peripheral portion of the substrate and peeling the adhesive tape off the peripheral portion of the substrate to remove a material of the substrate together with the adhesive tape.

In an embodiment, the first irradiation process and the second irradiation process are repeated alternately.

In an embodiment, there is provided a substrate processing method comprising: holding a substrate on a substrate stage; rotating the substrate stage and the substrate about an axis of the substrate stage; and directing a laser beam to the rotating substrate in a tangential direction of the substrate to remove a material of the substrate from a peripheral portion of the substrate.

In an embodiment, the laser beam is moved inwardly in a radial direction of the substrate relative to the substrate while the laser beam is being directed to the substrate.

In an embodiment, the substrate processing method further comprises pressing a polishing tool against a portion of the substrate from which the material has been removed.

In an embodiment, there is provided a substrate processing apparatus comprising: a substrate stage having a stage surface for holding a substrate thereon; a stage motor configured to rotate the substrate stage about its own axis; a laser head disposed above the stage surface, the laser head being arranged to direct a laser beam to an edge portion of the substrate on the stage surface; a pressing member disposed at a position away from the axis of the substrate stage, the pressing member being configured to press a polishing tool against the edge portion of the substrate; and a pressing device configured to exert a pressing force on the pressing member.

In an embodiment, the laser head is perpendicular to the stage surface.

In an embodiment, the substrate processing apparatus further comprises a tilting mechanism configured to tilt the laser head from a direction that is perpendicular to the stage surface.

In an embodiment, the substrate processing apparatus further comprises a relatively-moving mechanism configured to move one of the substrate stage and the laser head relative to the other.

In an embodiment, the substrate processing apparatus further comprises a position detector configured to detect a position of an outermost contour of the substrate on the stage surface, wherein the relatively-moving mechanism configured to move one of the substrate stage and the laser head in a direction as to eliminate a change in a distance between the outermost contour and the laser head while the substrate stage is rotating.

In an embodiment, there is provided a substrate processing apparatus comprising: a substrate stage having a stage surface for holding a substrate thereon; a stage motor configured to rotate the substrate stage about its own axis; a laser head disposed above the stage surface, the laser head being arranged to direct a laser beam to a peripheral portion of the substrate on the stage surface; a relatively-moving mechanism configured to move one of the substrate stage and the laser head relative to the other; a tape sticking unit configured to attach an adhesive tape to an entirety of the peripheral portion of the substrate; and a tape peeling unit configured to peel the adhesive tape off the peripheral portion of the substrate.

In an embodiment, the substrate processing apparatus further comprises a tilting mechanism configured to tilt the laser head from a direction that is perpendicular to the stage surface.

In an embodiment, there is provided a substrate processing apparatus comprising: a substrate stage having a stage surface for holding a substrate thereon; a stage motor configured to rotate the substrate stage about its own axis; a laser head disposed parallel to the stage surface, the laser head being arranged to direct a laser beam in a tangential direction of the substrate; and a relatively-moving mechanism configured to move one of the substrate stage and the laser head relative to the other.

In an embodiment, the substrate processing apparatus further comprises a pressing member disposed at a position away from the axis of the substrate stage, the pressing member being configured to press a polishing tool against the edge portion of the substrate; and a pressing device configured to exert a pressing force on the pressing member.

According to the embodiments described above, a laser beam creates a crack in an edge portion of a substrate. Since the crack serves as a boundary of a stepped recess to be formed in a peripheral portion of the substrate, the stepped recess can be formed highly accurately in the peripheral portion of the substrate.

DESCRIPTION OF EMBODIMENTS

Embodiments will now be described with reference to the drawings.

Figure 1A:
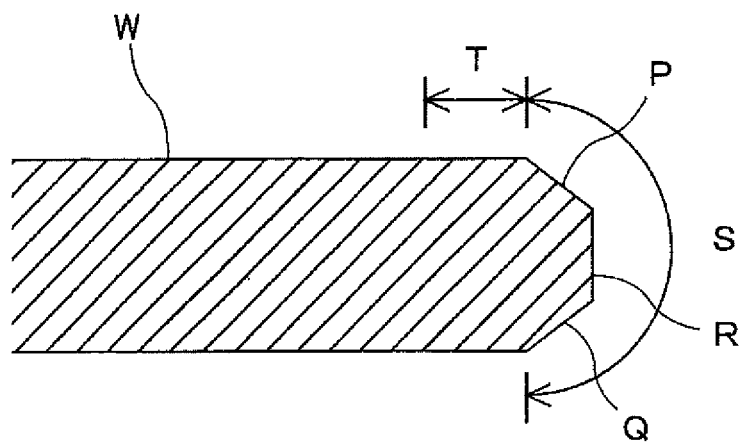
FIG. 1A and FIG. 1B are enlarged cross-sectional views each showing a peripheral portion of a substrate shown by way of example.
Figure 1B:
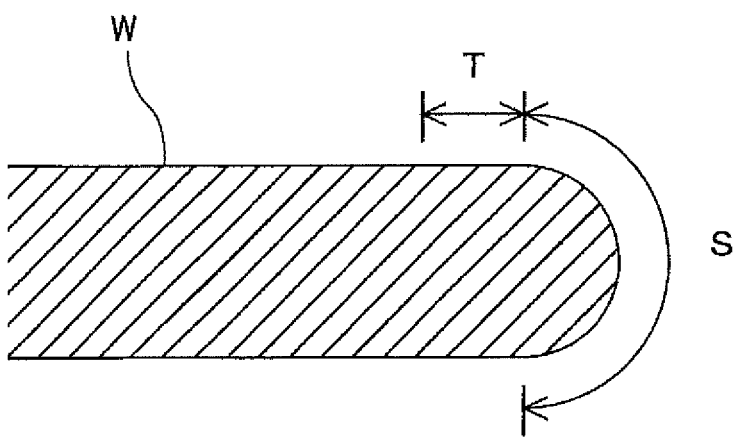

FIGS. 1A and 1B are enlarged cross-sectional views each showing a peripheral portion of a substrate (e.g., a wafer). More specifically, FIG. 1A is a cross sectional view of a substrate of a so-called straight type, and FIG. 1B is a cross sectional view of a substrate of a so-called round type. The peripheral portion of the substrate includes a bevel portion and an edge portion. In a substrate W shown in FIG. 1A, a bevel portion is an outermost circumferential surface (indicated by symbol S) including an upper slope (or an upper bevel portion) P, a lower slope (or a lower bevel portion) Q, and a side portion (or an apex) R of the substrate W. In a substrate W shown in FIG. 1B, a bevel portion is a portion (indicated by symbol S) constituting an outermost circumferential surface of the substrate W and having a curved cross section. The edge portion is a flat portion T located radially inwardly of the bevel portion S. The edge portion T may include a region where devices are formed. The edge portion T is also referred to as a top edge portion.

Figure 2:
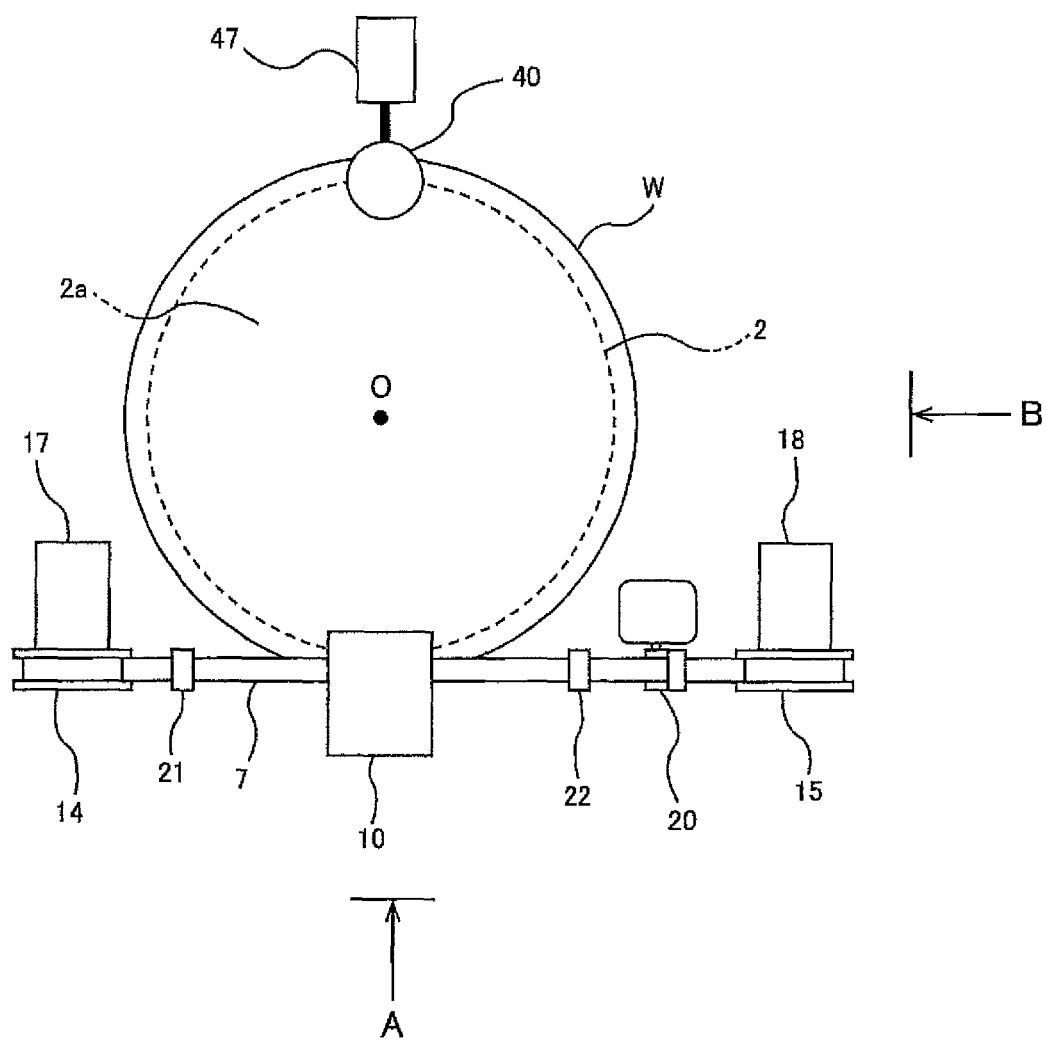
FIG. 2 is a plan view schematically showing an embodiment of a substrate processing apparatus.
Figure 3:
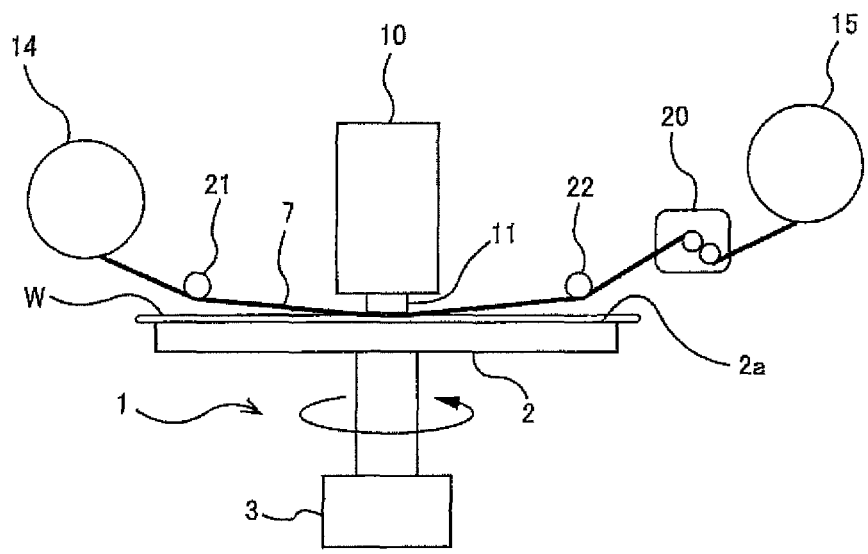
FIG. 3 is a side elevational view of the substrate processing apparatus shown in FIG. 2 as viewed from a direction indicated by an arrow A.
Figure 4:
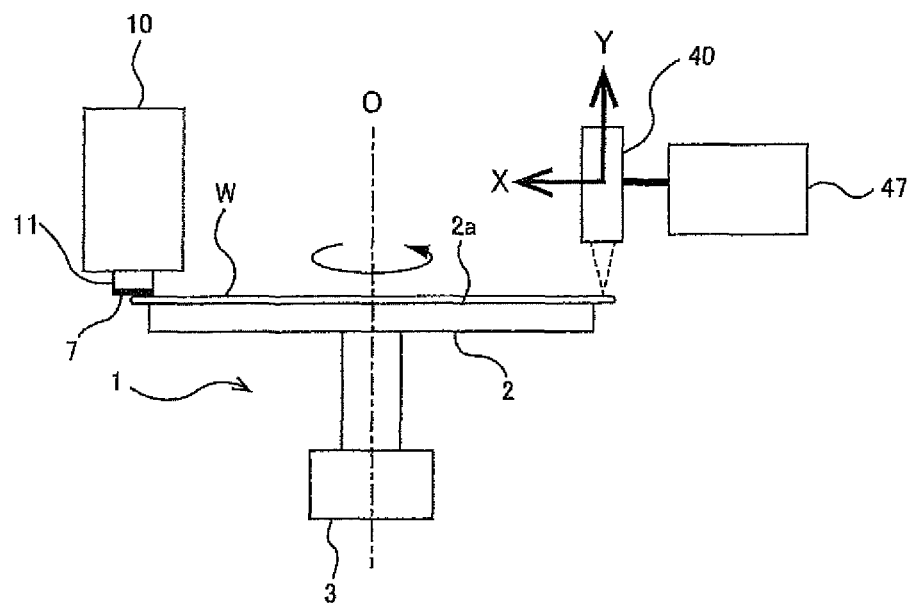
FIG. 4 is a side elevational view of the substrate processing apparatus shown in FIG. 2 as viewed from a direction indicated by an arrow B.

FIG. 2 is a plan view schematically showing an embodiment of a substrate processing apparatus, and FIG. 3 is a side view of the substrate processing apparatus shown in FIG. 2. FIG. 4 is a side elevational view of the substrate processing apparatus shown in FIG. 2 as viewed from a direction indicated by an arrow B. The substrate processing apparatus includes a substrate holder 1 capable of holding and rotating a substrate (e.g., wafer) W. This substrate holder 1 has a substrate stage 2 capable of holding the substrate W thereon, and a stage motor 3 for rotating the substrate stage 2 about its axis O. The substrate stage 2 has an upper surface which provides a stage surface 2a for holding the substrate W. The substrate stage 2 is coupled to the stage motor 3, and the stage surface 2a of the substrate stage 2 can be rotated about the axis O of the substrate stage 2 by the stage motor 3. The substrate W, to be polished, is held on the stage surface 2a of the substrate stage 2 by vacuum suction or other holding technique, and is rotated together with the substrate stage 2 by the stage motor 3.

The substrate processing apparatus includes a polishing head 10 having a pressing member 11 for pressing a polishing tape 7 against an edge portion of the substrate W. The pressing member 11 is located above the substrate stage 2, and is located away from the axis O of the substrate stage 2. More specifically, the pressing member 11 is located above the edge portion of the substrate W heled on the stage surface 2a.

The polishing tape 7 is a polishing tool for polishing the substrate W. One end of the polishing tape 7 is secured to a feeding reel 14, and the other end of the polishing tape 7 is secured to a take-up reel 15. Most part of the polishing tape 7 is wound on both the feeding reel 14 and the take-up reel 15, and a part of the polishing tape 7 extends between the feeding reel 14 and the take-up reel 15. The feeding reel 14 and the take-up reel 15 are coupled to reel motors 17, 18, respectively, which apply torques in opposite directions to the feeding reel 14 and the take-up reel 15, respectively, to thereby apply a tension to the polishing tape 7.

A tape-advancing device 20 is disposed between the feeding reel 14 and the take-up reel 15. The polishing tape 7 is advanced by the tape-advancing device 20 at a constant speed from the feeding reel 14 to the take-up reel 15. The polishing tape 7, extending between the feeding reel 14 and the take-up reel 15, is supported by two guide rollers 21, 22. These two guide rollers 21, 22 are arranged between the feeding reel 14 and the take-up reel 15. A lower surface of the polishing tape 7 extending between the guide rollers 21, 22 serves as a polishing surface for polishing the substrate W. Instead of the polishing tape 7, a fixed abrasive (or whetstone) may be used as the polishing tool.

The pressing member 11 is located between the two guide rollers 21, 22. These guide rollers 21, 22 are arranged such that the polishing tape 7, existing between the guide rollers 21, 22, extends in a tangential direction of the substrate W at a contact point between the edge portion of the substrate W and the polishing tape 7.

Figure 5:
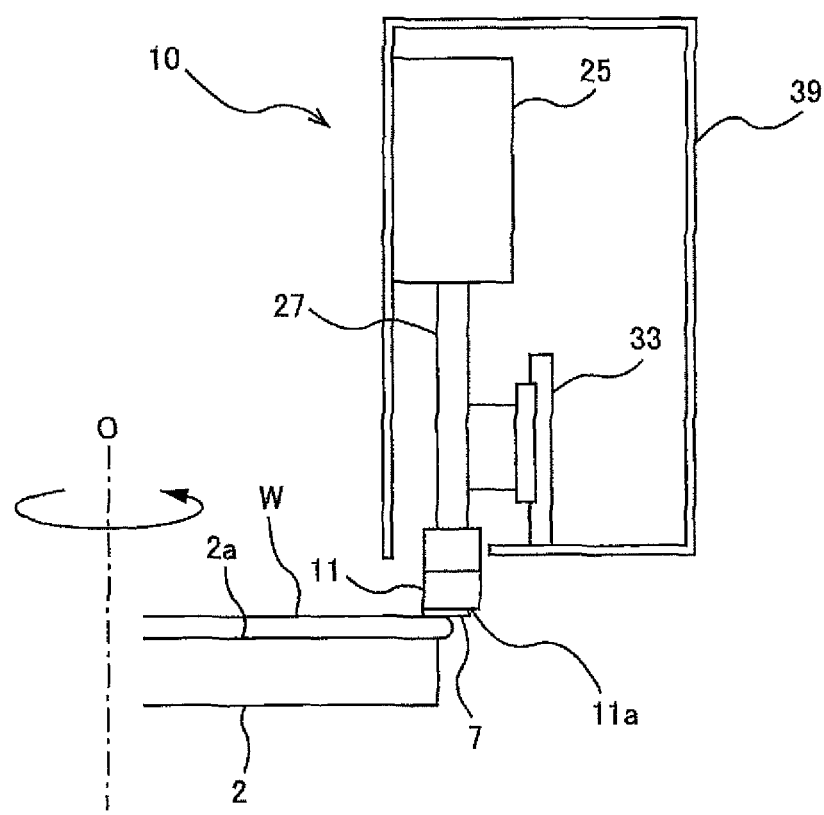
FIG. 5 is a schematic view showing a structure of a polishing head.

FIG. 5 is a schematic view showing the structure of the polishing head 10. As shown in FIG. 5, the polishing head 10 includes the pressing member 11 for pressing the polishing tape 7 against the edge portion of the substrate W and an air cylinder 25, serving as a pressing device, for applying a pressing force to the pressing member 11. The pressing member 11 is fixed to an end portion of a piston rod 27 of the air cylinder 25, so that the pressing member 11 can move together with the piston rod 27. As described above, the pressing member 11 is located at a position spaced from the axis O of the substrate stage 2.

The pressing member 11 has a pressing surface 11a lying parallel to the stage surface 2a, and is arranged to press the polishing tape 7 against the edge portion of the substrate W with the pressing surface 11a. The piston rod 27 of the air cylinder 25 is movably coupled to a linear-motion guide 33 which extends parallel to the axis O of the substrate stage 2. Therefore, a direction of movement of the piston rod 27 and the pressing member 11 is limited to a direction parallel to the axis O of the substrate stage 2, i.e., a direction perpendicular to the surface of the substrate W on the stage surface 2a. In the present embodiment, the axis O of the substrate stage 2 extends in a vertical direction. The polishing head 10 further includes a housing 39. The air cylinder 25 and the linear-motion guide 33 are disposed in the housing 39, and the pressing member 11 is disposed outside the housing 39.

The substrate W is polished as follows. The substrate W is held on the substrate stage 2 such that a film (e.g., a device layer) formed on the surface of the substrate W faces upwardly, and is rotated together with the substrate stage 2 about the axis O thereof. The center of the rotating substrate W is supplied with a liquid (e.g., pure water) from a liquid supply nozzle which is not shown in the drawing. The pressing member 11 of the polishing head 10 then presses the polishing tape 7 against the edge portion of the substrate W. The rotating substrate W and the polishing tape 7 are placed in sliding contact with each other, and as a result, the substrate W is polished. As shown in FIG. 2, while the substrate W is being polished, the polishing tape 7 extends in the tangential direction of the substrate W at a point where the substrate W and the polishing tape 7 contact each other.

The substrate processing apparatus also includes a laser head 40 for directing a laser beam to the peripheral portion of the substrate W held on the stage surface 2a of the substrate stage 2. The laser head 40 is disposed above the stage surface 2a. More specifically, the laser head 40 is located right above the edge portion of the substrate W held on the stage surface 2a. In this embodiment, the laser head 40 is perpendicular to the stage surface 2a.

As shown in FIG. 4, the laser head 40 is coupled to a relatively-moving mechanism 47. The relatively-moving mechanism 47 is configured to be able to move the laser head 40 in an X direction perpendicular to the axis O of the substrate stage 2 and in a Y direction which is parallel to the axis O of the substrate stage 2. The X direction coincides with a radial direction of the stage surface 2a, i.e., a radial direction of the substrate W. The relatively-moving mechanism 47 may be configured to be able to move the laser head 40 also in a Z direction perpendicular to both the X direction and the Y direction. A relative position of the substrate W on the stage surface 2a of the substrate stage 2 and the laser head 40 can be changed by the relatively-moving mechanism 47.

In one embodiment, the relatively-moving mechanism 47 may comprise a combination of a plurality of ball screw mechanisms and a plurality of corresponding servomotors. The relatively-moving mechanism 47 may be coupled to the substrate stage 2, instead of the laser head 40. More specifically, the relatively-moving mechanism 47 may be configured to move the substrate stage 2 in the X direction and in the Y direction (and in the Z direction). The relatively-moving mechanism 47 having such a structure is capable of changing the relative position of the substrate W on the stage surface 2a of the substrate stage 2 and the laser head 40.

Figure 6:
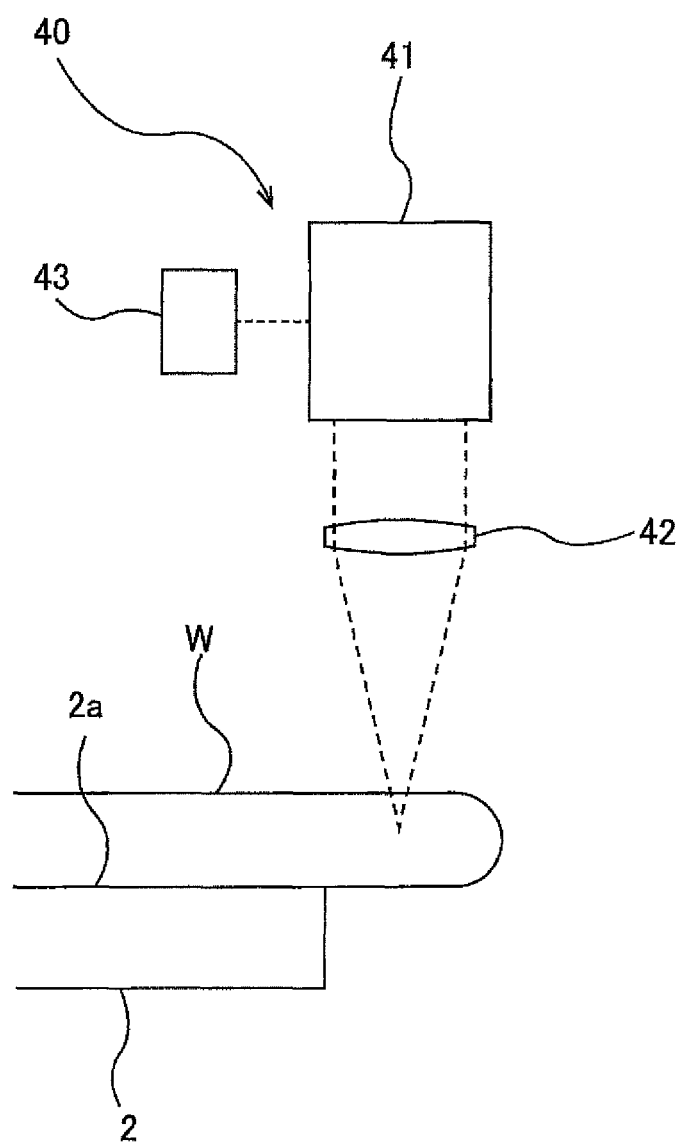
FIG. 6 is a schematic view illustrating a structure of a laser head.

FIG. 6 is a schematic view showing the structure of the laser head 40. The laser head 40 comprises a laser beam source 41 configured to emit a laser beam, a focusing lens 42 configured to converge the laser beam, and a laser controller 43 configured to control the operation of the laser beam source 41. According to the present embodiment, the laser beam source 41 is configured to emit a pulsed laser beam whose pulse width and output power level are controlled by the laser controller 43. A device that can be used as the laser head 40 in the present embodiment may comprise a product manufactured and sold by Hamamatsu Photonics K.K. Usually, devices are fabricated on the surface of the substrate W, and should not be adversely affected as much as possible when the substrate W is polished. The laser beam according to the present embodiment has such a wavelength that it permeates the substrate W in order to solve technical problems such as heat generated when the substrate W is laser-processed by a conventional laser ablation process and contaminations due to particles from the substrate W. The laser beam that has such a wavelength is effective to minimize adverse effects of heat and contaminations on the device area of the substrate W. Depending on the thickness of the workpiece, i.e., the substrate W, irradiated with the laser beam, the depth of focus in the substrate W may be in the range from several micrometers to several hundreds micrometers, for example. If the substrate W has a thickness of several tens micrometers, for example, then the depth of focus may be of about several micrometers.

The laser bead 40 is disposed above the edge portion of the substrate W on the stage surface 2a. The laser beam emitted from the laser head 40 is directed to the edge portion of the substrate W, thus forming a crack in the edge portion of the substrate W. The crack extends in a traveling direction of the laser beam. According to the present embodiment, the laser head 40 is disposed perpendicularly to the surface (i.e., the upper surface) of the substrate W held on the stage surface 2a, and the incident laser beam is perpendicular to the surface of the substrate W. According to the present embodiment, therefore, the crack extends perpendicularly to the surface of the substrate W.

Figure 7:
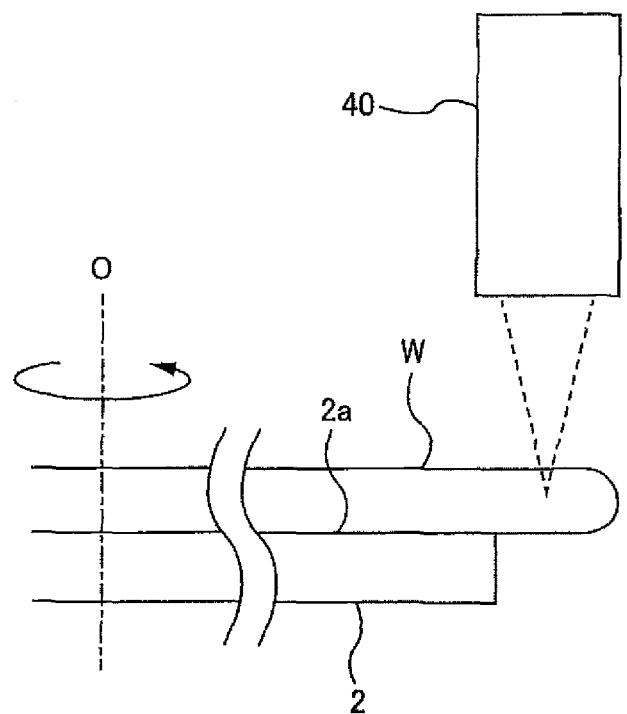
FIG. 7 is a view showing a process of directing a laser beam to a substrate.
Figure 8:
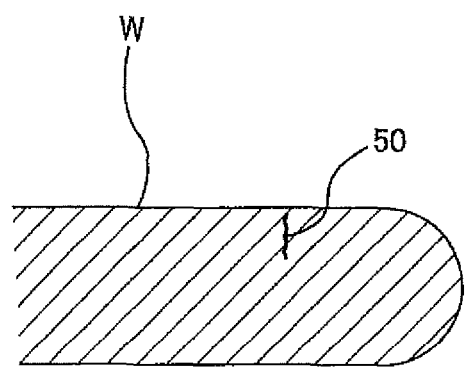
FIG. 8 is a cross-sectional view showing a crack created in the substrate.
Figure 9:
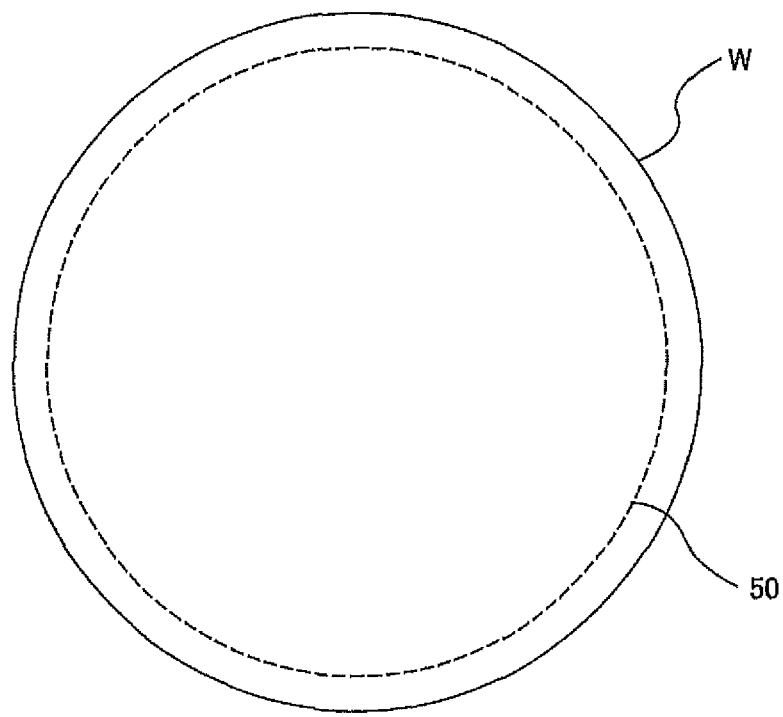
FIG. 9 is a plan view showing the crack created in the substrate.

Next, a method of processing a substrate using the above-described substrate processing apparatus will be described below with reference to FIGS. 7 through 11. As shown in FIG. 7, the substrate W is placed on the stage surface 2a of the substrate stage 2 and held on the stage surface 2a. While the substrate stage 2 and the substrate W are being rotated about the axis O by the stage motor 3, the laser head 40 directs the laser beam to the edge portion (see the reference character T in FIGS. 1A and 1B) of the substrate W, thereby forming an annular crack 50 in the edge portion of the substrate W, as shown in FIGS. 8 and 9. The annular crack 50 serves as a scribe line. The annular crack 50 may be a continuous crack or a discontinuous crack.

Figure 10:
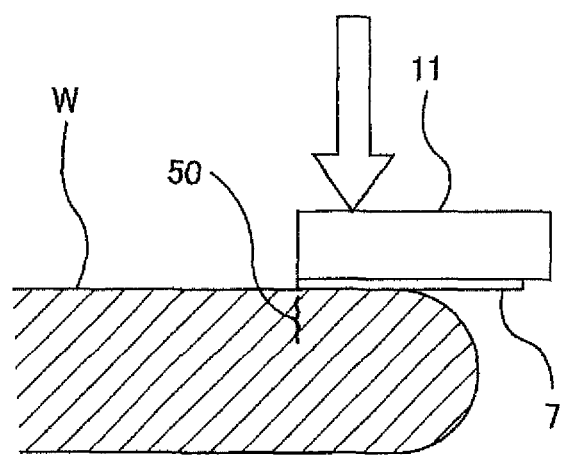
FIG. 10 is a view showing a process of bringing a polishing tape into contact with the substrate.
Figure 11:
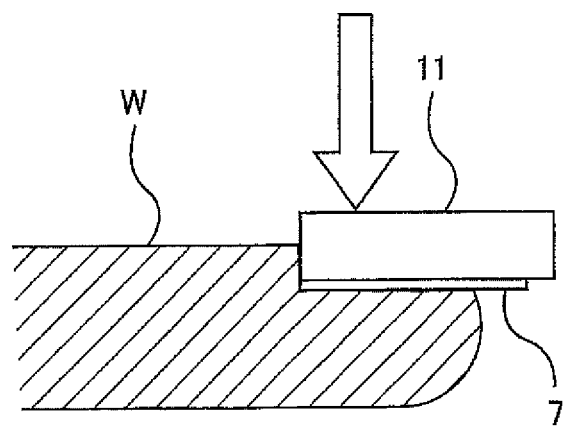
FIG. 11 is a view showing a process of pressing the polishing tape against the substrate.

While a liquid (e.g., pure water) is being supplied onto the surface (upper surface) of the substrate W, the pressing member 11 brings the polishing tape 7 into contact with the edge portion of the substrate W with an inner side edge of the polishing tape 7 in alignment with the crack 50, as shown in FIG. 10. The air cylinder 25 exerts a pressing force on the pressing member 11, which in turn presses the polishing tape 7 against the edge portion of the substrate W. The edge portion of the substrate W is polished by the contacting polishing tape 7 in the presence of the liquid. As shown in FIG. 11, the pressing member 11 keeps pressing the polishing tape 7 against the edge portion of the substrate W until a stepped recess is formed in the peripheral portion of the substrate W. In this manner, the stepped recess, which has a right-angled cross section, is formed.

According to the above-described embodiment, the crack 50 can be formed in the edge portion of the substrate W by the laser beam. As the crack 50 functions as a boundary of a stepped recess to be formed in the peripheral portion of the substrate W, the stepped recess can be formed highly accurately in the peripheral portion of the substrate W.

Figure 12:
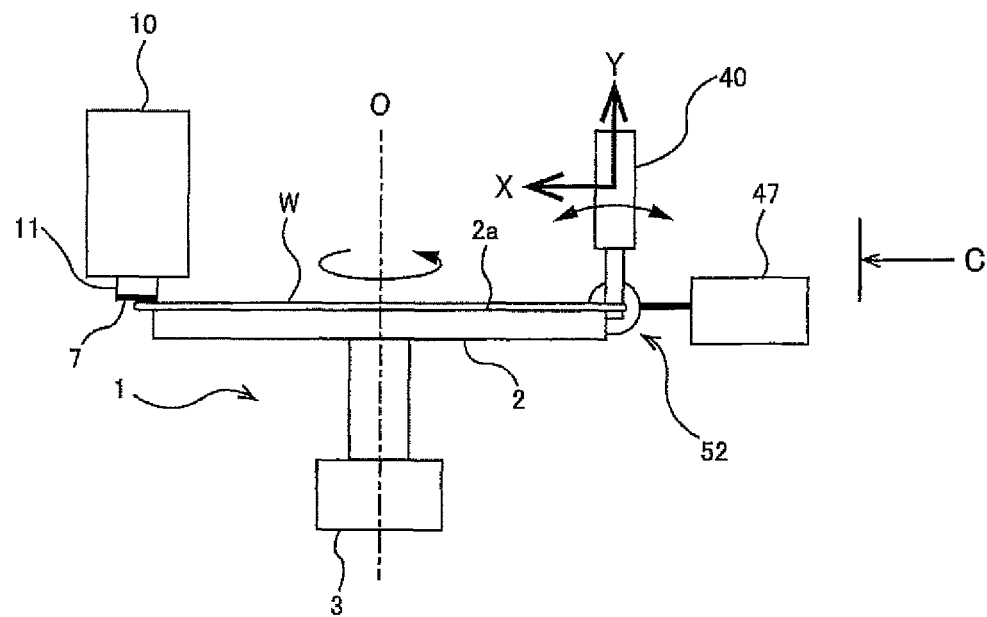
FIG. 12 is a side elevational view schematically showing a substrate processing apparatus according to an embodiment.
Figure 13:
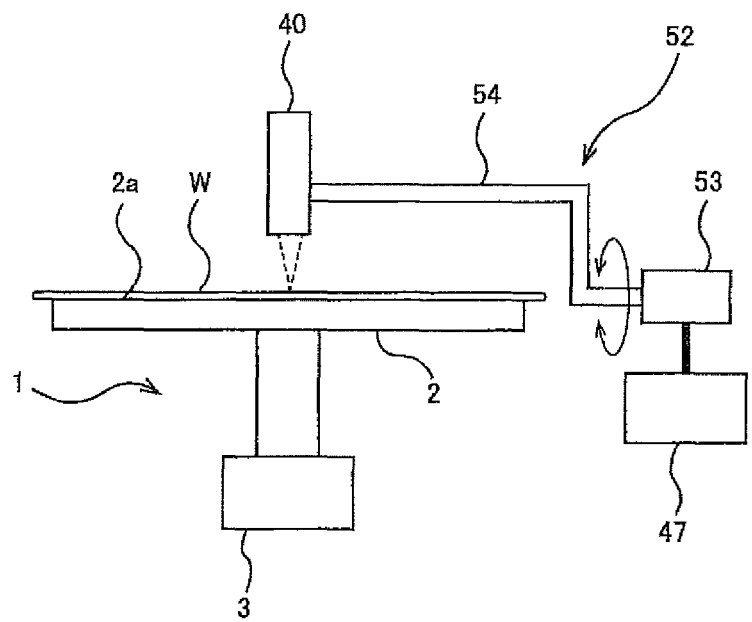
FIG. 13 is a side elevational view of the substrate processing apparatus shown in FIG. 12 as viewed from a direction indicated by an arrow C.

A substrate processing apparatus according to another embodiment will be described below with reference to FIGS. 12 and 13. Structural and operational details of this embodiment, which will not be described below in particular, are identical to those of the previous embodiment, and their repetitive descriptions will be omitted. FIG. 12 is a side elevational view schematically showing an embodiment of the substrate processing apparatus, and FIG. 13 is a side elevational view of the substrate processing apparatus shown in FIG. 12 as viewed from a direction indicated by an arrow C. The substrate processing apparatus according to the present embodiment is provided with a tilting mechanism 52 configured to be able to tilt the laser head 40 from a direction perpendicular to the stage surface 2a. The tilting mechanism 52 includes a servomotor 53 and a crank arm 54 as a coupling member which is coupled to the servomotor 53. One end of the crank arm 54 is secured to a rotational shaft of the servomotor 53, whereas the other end of the crank arm 54 is secured to the laser head 40.

In this embodiment, the relatively-moving mechanism 47 is coupled to the laser head 40 through the tilting mechanism 52. More specifically, the relatively-moving mechanism 47 is secured to the servomotor 53 of the tilting mechanism 52. With this arrangement, the relatively-moving mechanism 47 is able to move the tilting mechanism 52 and the laser head 40 together in the X direction and in the Y direction. The relatively-moving mechanism 47 may be coupled to the substrate stage 2, instead of the tilting mechanism 52.

The rotational shaft of the servomotor 53 extends in a tangential direction of the substrate W and is located at the same height as the substrate W. Therefore, when the servomotor 53 is set in motion, the crank arm 54 is rotated, thereby tilting the laser head 40 inwardly or outwardly in the radial direction of the substrate W. A home position of the laser head 40 is a position perpendicular to the stage surface 2a.

Figure 14:
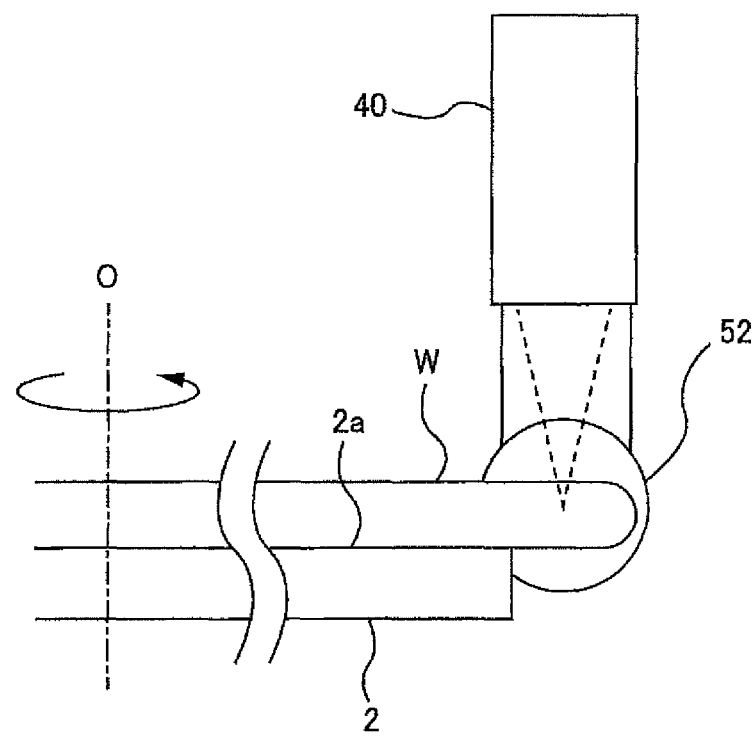
FIG. 14 is a view showing an embodiment of the laser head which is parallel to an axis of a substrate stage.
Figure 15:
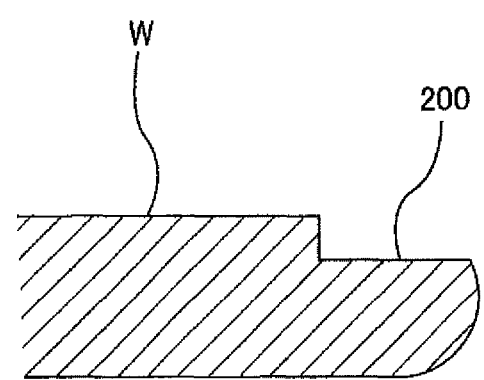
FIG. 15 is a view showing a recess having a surface which is perpendicular to a surface (or an upper surface) of the substrate.
Figure 16:
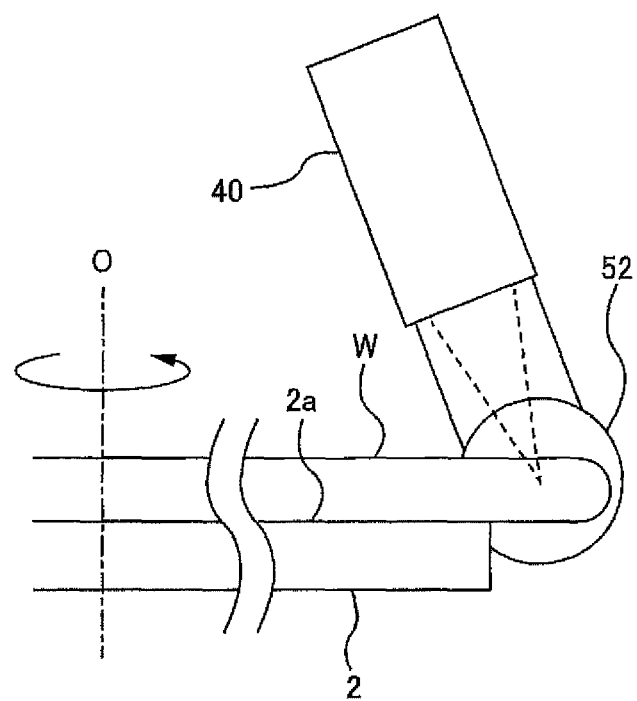
FIG. 16 is a view showing an embodiment of the laser head which is inclined inwardly toward the axis of the substrate stage.
Figure 17:
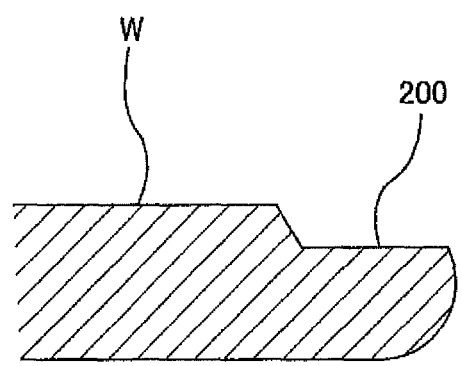
FIG. 17 is a view showing a recess having a surface inclined inwardly.
Figure 18:
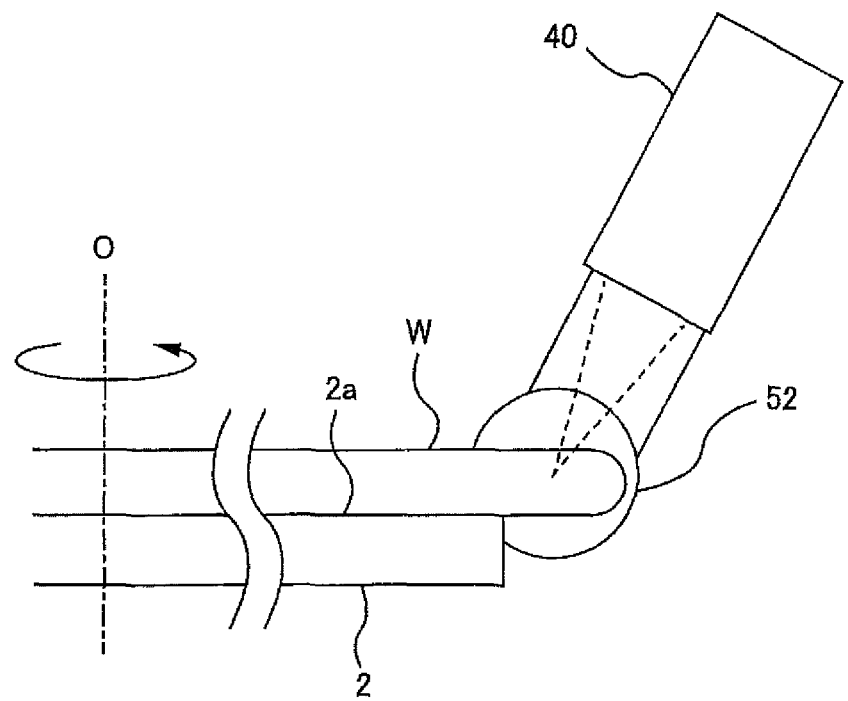
FIG. 18 is a view showing an embodiment of the laser head which is inclined outwardly in a direction away from the axis of the substrate stage.
Figure 19:
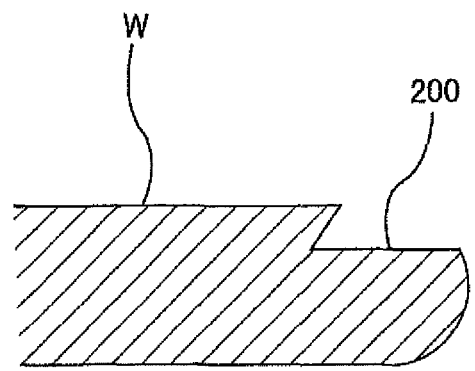
FIG. 19 is a view showing a recess having a surface inclined outwardly.

The tilting mechanism 52 can tilt the laser head 40 at various angles. FIG. 14 is a view showing an embodiment of the laser head 40 which is parallel to the axis O of the substrate stage 2. The laser head 40 in such a perpendicular position is capable of forming a recess 200 having a surface perpendicular to the surface (upper surface) of the substrate W, as shown in FIG. 15. FIG. 16 is a view showing an embodiment of the laser head 40 which is inclined inwardly toward the axis O of the substrate stage 2. The laser head 40 in such a tilted position is capable of forming a recess 200 having an inwardly inclined surface, as shown in FIG. 17. FIG. 18 is a view showing an embodiment of the laser head 40 which is inclined outwardly in a direction away from the axis O of the substrate stage 2. The laser head 40 in such a tilted position is capable of forming a recess 200 having an outwardly inclined surface, as shown in FIG. 19.

Figure 20:
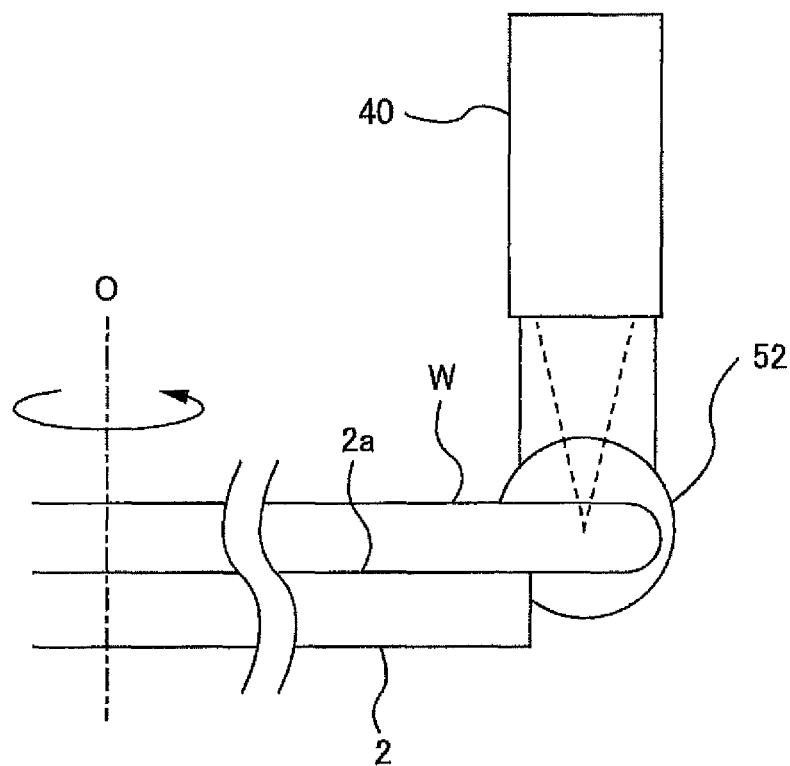
FIG. 20 is a view showing a process of directing a laser beam to a substrate.
Figure 21:
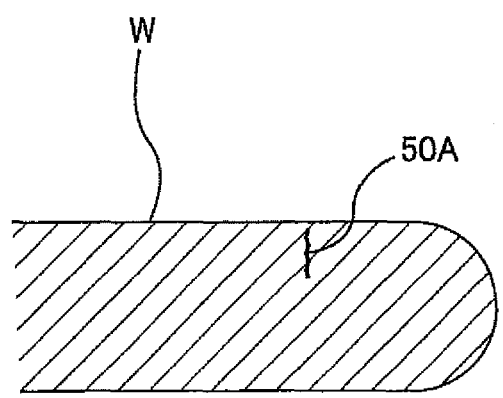
FIG. 21 is a cross-sectional view showing a crack created in the substrate.
Figure 22:
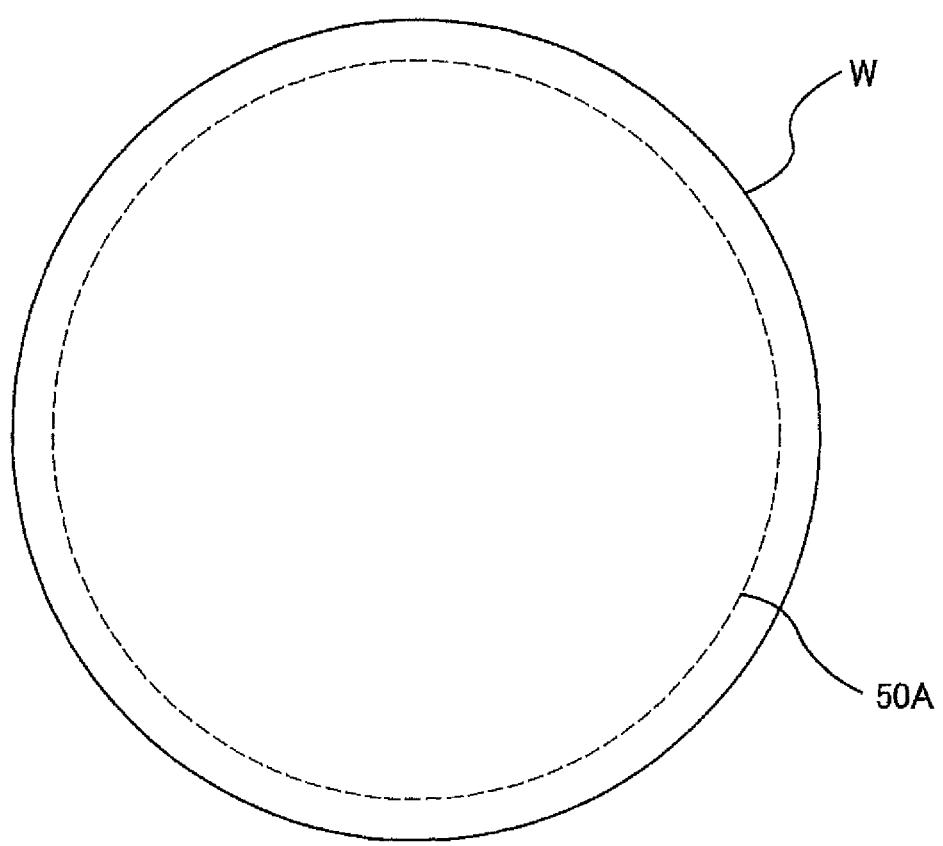
FIG. 22 is a plan view showing the crack created in the substrate.

An embodiment of a method of processing a substrate using the substrate processing apparatus shown in FIGS. 12 and 13 will be described below with reference to FIGS. 20 through 24. As shown in FIG. 20, the substrate W is placed on the stage surface 2a of the substrate stage 2 and held on the stage surface 2a. While the substrate stage 2 and the substrate W are being rotated about the axis O by the stage motor 3, the laser head 40 irradiates the peripheral portion of the substrate W with the laser beam, thus forming a first annular crack 50A in the peripheral portion of the substrate W, as shown in FIGS. 21 and 22. This process of forming the first annular crack 50A is referred to as a first irradiation process.

Figure 23:
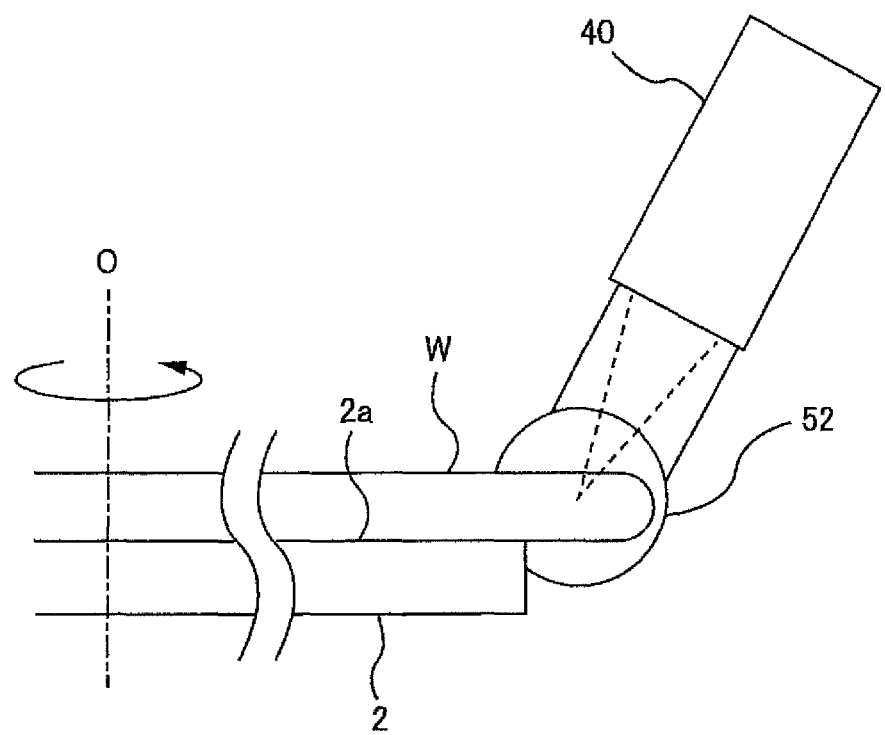
FIG. 23 is a view showing a process of directing a laser beam from the outwardly inclined laser head to a substrate.
Figure 24:
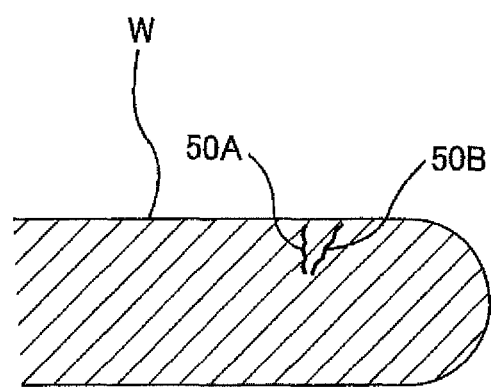
FIG. 24 is a cross-sectional view showing cracks created in a substrate.
Figure 25:
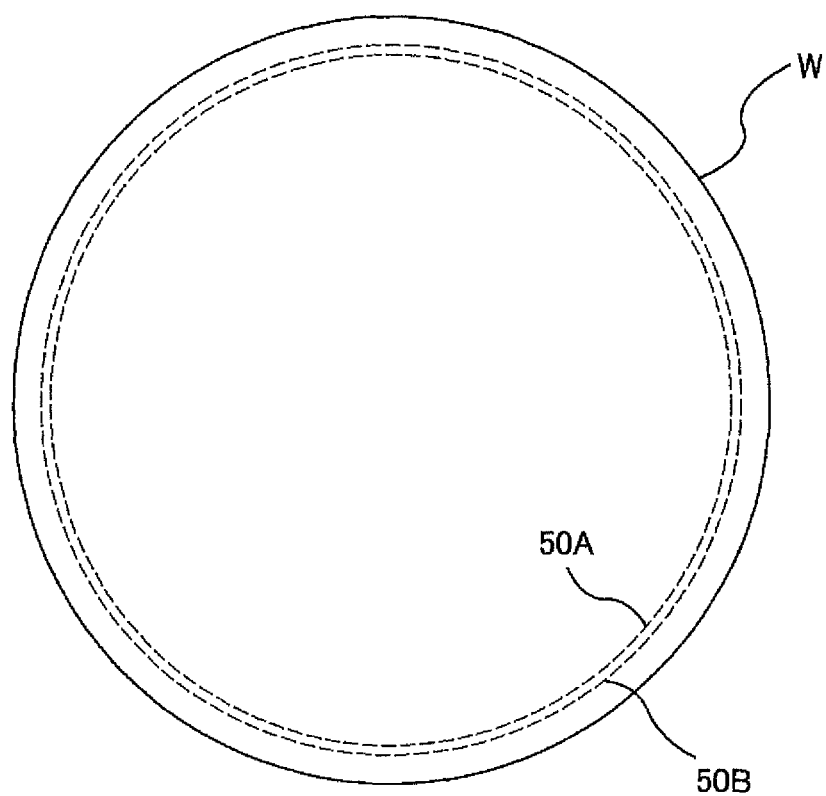
FIG. 25 is a plan view showing the cracks created in the substrate.
Figure 26:
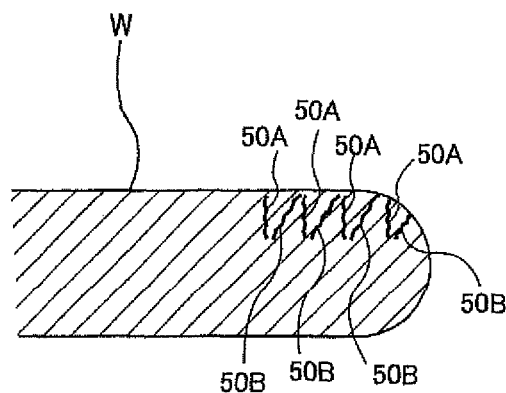
FIG. 26 is a cross-sectional view showing concentric annular cracks in a substrate.
Figure 27:
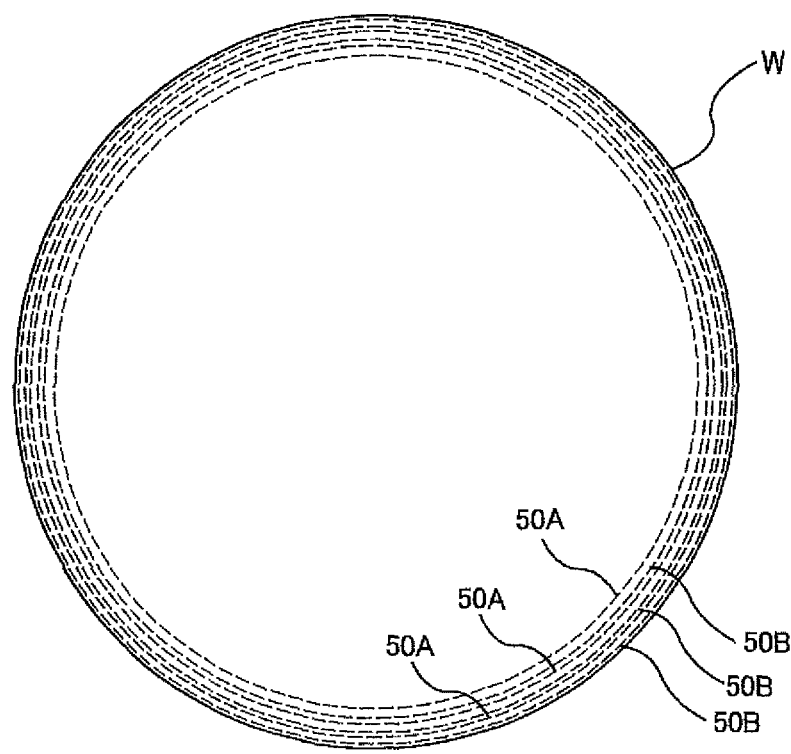
FIG. 27 is a plan view showing the concentric annular cracks in the substrate.

Subsequently, as shown in FIG. 23, the laser head 40 irradiates the peripheral portion of the substrate W with the laser beam at an incident angle different from an incident angle of the laser beam in the first irradiation process, thus forming a second annular crack 50B in the peripheral portion of the substrate W, as shown in FIGS. 24 and 25. This process of forming the second annular crack 50B is referred to as a second irradiation process. The first irradiation process and the second irradiation process are repeated a plurality of times, thereby forming a plurality of concentric annular cracks 50A, 50B that include a plurality of concentric first annular cracks 50A and a plurality of concentric second annular cracks 50B in the peripheral portion of the substrate W, i.e., in the entirety of the edge portion and in a part of the bevel portion of the substrate W, as shown in FIGS. 26 and 27. The first annular cracks 50A and the second annular cracks 50B are arranged alternately.

Each time the first irradiation process is carried out and each time the second irradiation process is carried out, the incident position of the laser beam on the peripheral portion of the substrate W is moved by the relatively-moving mechanism 47. In this embodiment, the incident position of the laser beam is moved outwardly each time the first irradiation process is carried out and each time the second irradiation process is carried out. In one embodiment, the incident position of the laser beam may be moved inwardly each time the first irradiation process and the second irradiation process are carried out.

In this embodiment, the first irradiation process and the second irradiation process are repeated alternately. Therefore, the first annular cracks 50A and the second annular cracks 50B are formed alternately. In one embodiment, the first irradiation process may be repeated a plurality of times, and then the second irradiation process may be repeated a plurality of times. In this case, a plurality of concentric first annular cracks 50A are formed first, and thereafter a plurality of concentric second annular cracks 50B are formed. In both cases, as shown in FIGS. 26 and 27, the first annular cracks 50A and the second annular cracks 50B are alternately arrayed. The innermost one of the first annular cracks 50A serves as the crack (or the scribe line) in the embodiment shown in FIGS. 8 and 9.

Figure 28:
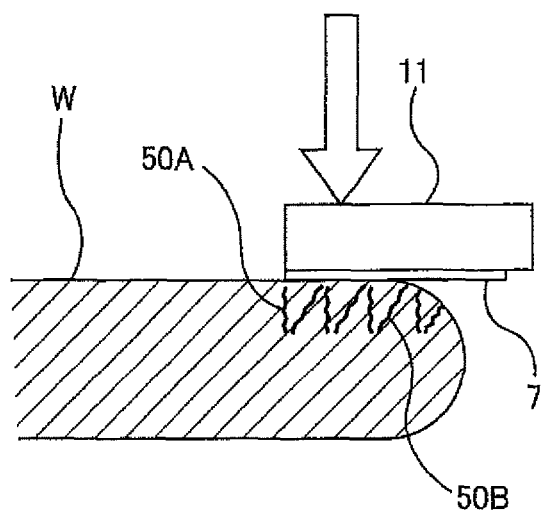
FIG. 28 is a view showing a process of bringing a polishing tape into contact with the substrate.
Figure 29:
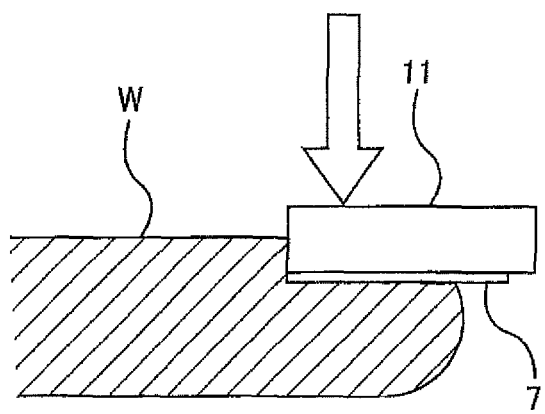
FIG. 29 is a view showing a process of pressing the polishing tape against the substrate.

After the concentric annular cracks are formed in the peripheral portion of the substrate W, the peripheral portion of the substrate W is polished using the polishing tape 7. More specifically, while a liquid (e.g., pure water) is being supplied onto the surface (upper surface) of the substrate W, the pressing member 11 brings the polishing tape 7 into contact with the edge portion of the substrate W with an inner side edge of the polishing tape 7 in alignment with the innermost first annular crack 50A, as shown in FIG. 28. The air cylinder 25 exerts a pressing force on the pressing member 11, which in turn presses the polishing tape 7 against the edge portion of the substrate W. The edge portion of the substrate W is polished by the contacting polishing tape 7 in the presence of the liquid. As shown in FIG. 29, the pressing member 11 keeps pressing the polishing tape 7 against the edge portion of the substrate W until a stepped recess is formed in the peripheral portion of the substrate W. In this manner, the stepped recess, which has a right-angled cross section, is formed.

Figure 30:
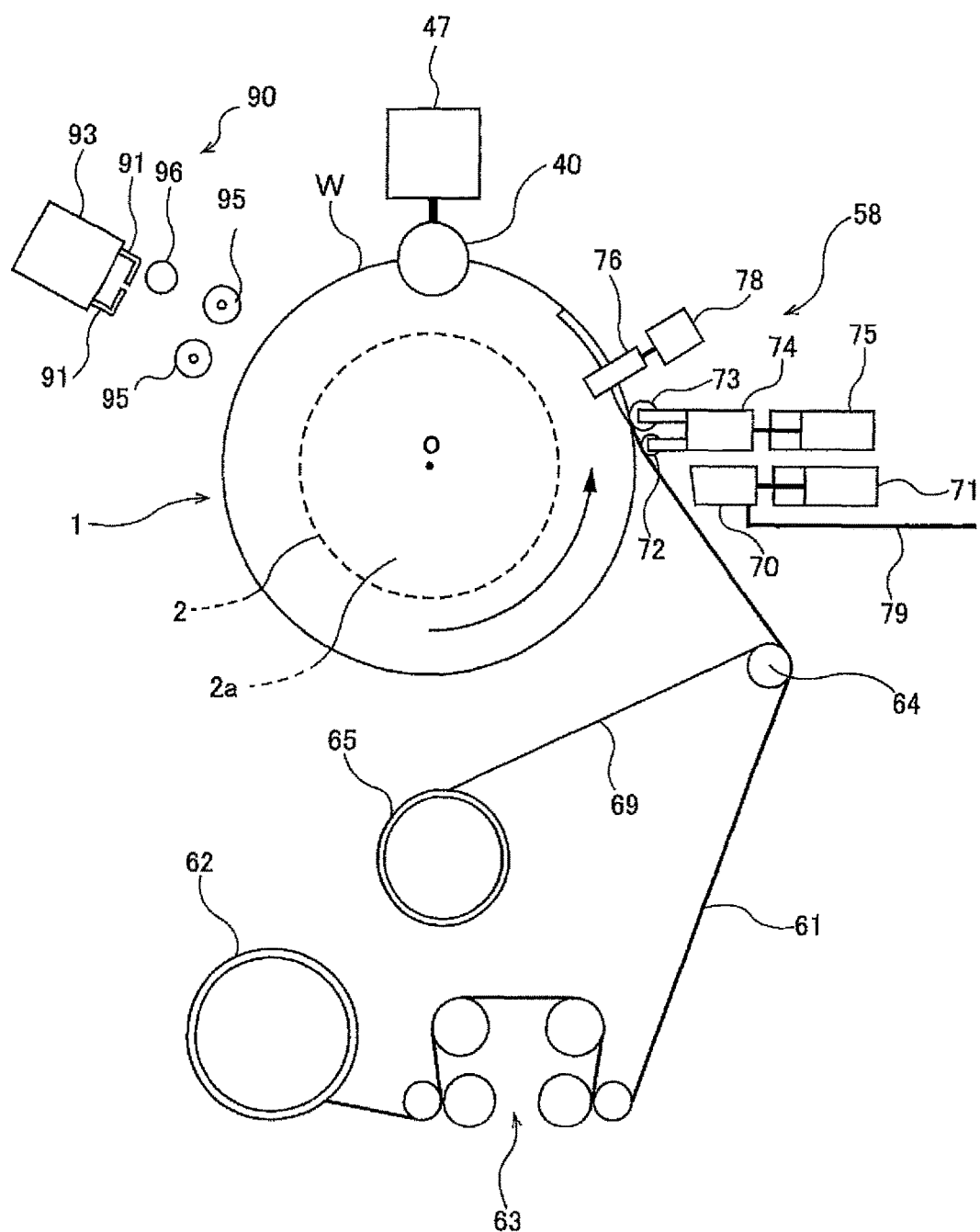
FIG. 30 is a plan view schematically showing a substrate processing apparatus according to an embodiment.

Next, a still another embodiment of the substrate processing apparatus will be described with reference to FIG. 30 through FIG. 36. Structures and operations of this embodiment, which will not be described particularly, are the same as those of the embodiments discussed previously, and their repetitive descriptions will be omitted. FIG. 30 is a plan view schematically showing an embodiment of the substrate processing apparatus. The substrate processing apparatus in this embodiment includes the substrate holder 1 for holding and rotating a substrate W. This substrate holder 1 has the same structure as the substrate holder 1 in the previous embodiments shown in FIG. 2 through FIG. 4.

The substrate processing apparatus according to the embodiment includes a tape sticking unit 58 for sticking an adhesive tape 61 onto the peripheral portion of the rotating substrate W held on the substrate stage 2. As shown in FIG. 30, the substrate W, held on the substrate stage 2, is rotated in a direction indicated by arrow shown in FIG. 30, while the adhesive tape 61 is stuck on the substrate W by the tape sticking unit 58.

The adhesive tape 61 to be supplied to the tape sticking unit 58 is held on a feeding roller 62. The adhesive tape 61, fed from the feeding roller 62, passes through a tension unit 63 having a plurality of rollers, where a desired tension is applied to the adhesive tape 61. The adhesive tape 61 that has passed through the tension unit 63 is supplied via a guide roller 64 to the tape sticking unit 58. A separation film 9, which is attached to an adhesive surface of the adhesive tape 61, is peeled off from the adhesive tape 61 when the adhesive tape 61 passes the guide roller 14, and is wound around a film take-up roller 65.

The adhesive tape 61 comprises a flexible base tape, and an adhesive layer formed on one surface of the base tape. A synthetic resin, such as polyolefin (PO), polyethylene (PE) or polyimide, can be used as a material of the base tape. A thickness of the adhesive tape 61 is, for example, 60 μm to 80 μm.

The tape sticking unit 58 includes a tape-holding head 70 for holding a beginning of the adhesive tape 61 and sticking the beginning onto the bevel portion (see the symbol S in FIGS. 1A and 1B) of the substrate W, a positioning roller 72 as a positioning member for performing positioning of the adhesive tape 61 in a direction perpendicular to the surface of the substrate W, and a side roller 73 for pressing the adhesive tape 61 against the bevel portion of the substrate W.

The tape sticking unit 58 further includes a first roller 76 for bending the adhesive tape 61, which has been pressed against the bevel portion of the substrate W, along a longitudinal direction of the adhesive tape 61 and sticking a bent portion of the adhesive tape 61 onto the edge portion (see the symbol T in FIGS. 1A and 1B) of the substrate W, and a second roller 77 for bending the adhesive tape 61, which has been pressed against the bevel portion of the substrate W, along the longitudinal direction of the adhesive tape 61 and sticking a bent portion of the adhesive tape 61 onto a back surface (which is a surface opposite from the edge portion across the substrate W) of the substrate W.

The first roller 76 is disposed above the second roller 77, and the peripheral portion of the substrate W is located between the first roller 76 and the second roller 77. Since the second roller 77 is located below the first roller 76, only the first roller 76 is shown in FIG. 30. The second roller 77 is shown in FIGS. 32A through 32C and FIG. 33.

The tape-holding head 70 is coupled to an electric cylinder 71 as a head actuator so that the tape-holding head 70 can move by the electric cylinder 71 in directions closer to and away from the peripheral portion of the substrate W. The tape-holding head 70 is configured to be capable of detachably holding the beginning of the adhesive tape 61. More specifically, the tape-holding head 70 is coupled to a vacuum line 79 so that the tape-holding head 70 can hold the beginning of the adhesive tape 61 by vacuum suction generated by the vacuum line 79.

Figure 31A:
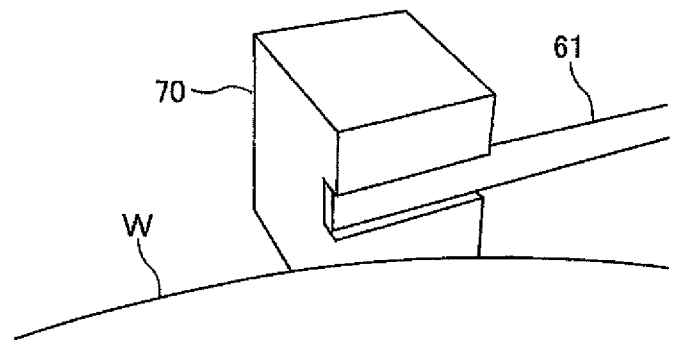
FIG. 31A, FIG. 31B, and FIG. 31C are perspective views each showing a process of attaching a beginning end of an adhesive tape to a bevel portion of a substrate with a tape-holding head.
Figure 31B:
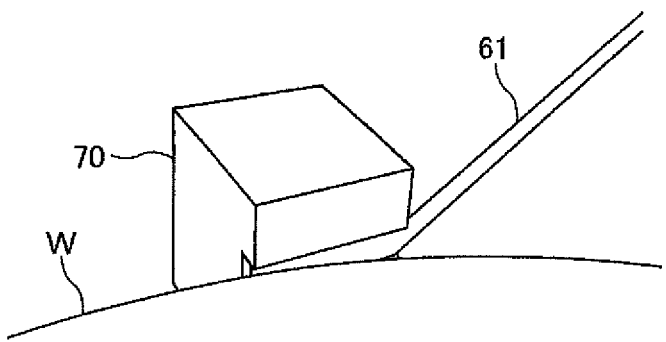
Figure 31C:
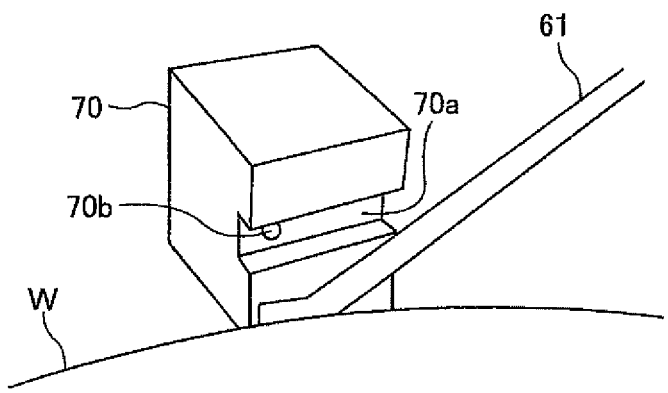

FIGS. 31A through 31C are perspective views each illustrating a process of sticking the beginning of the adhesive tape 61 onto the bevel portion of the substrate W by the tape-holding head 70. A tape holding groove 70a, extending parallel to the surface of the substrate W, is formed in a front face of the tape-holding head 70. A vacuum suction opening 70b, which enables the tape-holding head 70 to detachably hold the beginning of the adhesive tape 61, is formed in a bottom of the tape holding groove 70a. The vacuum suction opening 70b communicates with the above-described vacuum line 79.

The tape-holding head 70 operates as follows. As shown in FIG. 31A, the beginning of the adhesive tape 61 is held on the tape-holding head 70 by the vacuum suction. Next, as shown in FIG. 31B, the electric cylinder 71 is activated to move the tape-holding head 70 toward the bevel portion of the substrate W until the beginning of the adhesive tape 61 comes into contact with the bevel portion of the substrate W. Next, the vacuum suction by the vacuum line 79 is shut off and the tape-holding head 70 is moved away from the peripheral portion of the substrate W. By operating the tape-holding head 70 in this manner, the beginning of the adhesive tape 61 is stuck on the bevel portion of the substrate W as shown in FIG. 31C.

As shown in FIG. 30, the positioning roller 72 and the side roller 73 are rotatably secured to a common support 74. The axes of the positioning roller 72 and the side roller 73 extend in a direction perpendicular to the surface of the substrate W (i.e., in the vertical direction). The support 74 is coupled to an air cylinder 75 as a roller actuator.

When the air cylinder 75 is set in motion, the positioning roller 72 and the side roller 73 simultaneously move toward the bevel portion of the substrate W. The direction of the movement of the positioning roller 72 and the side roller 73 is parallel to the surface of the substrate W. The positioning roller 72 and the side roller 73 are arranged at different positions in their movement direction. Therefore, as shown in FIG. 30, while the side roller 73 presses the adhesive tape 61 against the bevel portion of the substrate W, the positioning roller 72 only touches a back surface (i.e., a surface opposite from the adhesive surface) of the adhesive tape 61 and dose not press the adhesive tape 61 against the bevel portion of the substrate W. The positioning roller 72 and the side roller 73 may be coupled to different air cylinders, respectively.

The first roller 76 and the second roller 77 are configured to be rotatable about their own axes. The axes of the first roller 76 and the second roller 77 extend parallel to the surface of the substrate W and extend in the radial direction of the substrate W. The first roller 76 and the second roller 77 are coupled to a roller moving device 78 which may be comprised of an air cylinder. When the roller moving device 78 is set in motion, the first roller 76 and the second roller 77 move in directions closer to and away from each other (i.e., in directions closer to and away from the peripheral portion of the substrate W). The directions of the movements of the first roller 76 and the second roller 77 are perpendicular to the surface of the substrate W.

With the above-described construction, the first roller 76 and the second roller 77 can bend the adhesive tape 61 along its longitudinal direction and stick the bent portions onto the edge portion and the back surface of the substrate W. In this embodiment the first roller 76 and the second roller 77 are disposed at positions as to sandwich the peripheral portion of the substrate W. In one embodiment, the first roller 76 and the second roller 77 may be disposed at different positions along the circumferential direction of the substrate W.

The positioning roller 72, the side roller 73, the first roller 76, and the second roller 77, which are configured to be rotatable, are not coupled to rotating devices, such as motors. Thus, these rollers 72, 73, 76, 77 are rotated by the contact with the adhesive tape 61 which is moving along with the rotation of the substrate W.

Figure 32A:
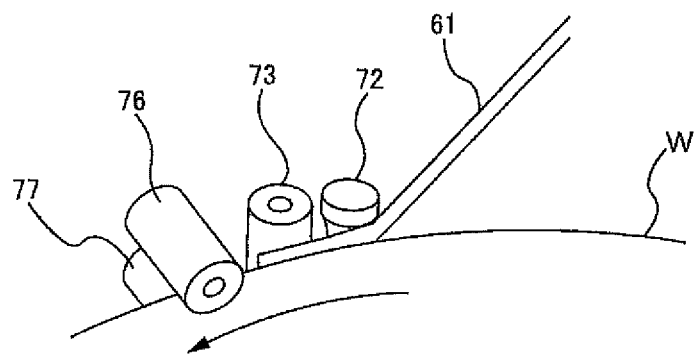
FIG. 32A, FIG. 32B, and FIG. 32C are perspective views each showing the manner in which the adhesive tape is attached to the substrate.

The operation of the tape sticking unit 58 will now be described. First, as shown in FIGS. 31A through 31C, the beginning of the adhesive tape 61 is stuck on the bevel portion of the substrate W by the tape-holding head 70. Next, the positioning roller 72 and the side roller 73 are moved toward the substrate W until the side roller 73 comes into contact with the bevel portion of the substrate W. The substrate W and the substrate stage 2, with the beginning of the adhesive tape 61 stuck on the bevel portion of the substrate W, are rotated about the axis O by the stage motor 3 (see FIGS. 3 and 4). As shown in FIG. 32A, the positioning roller 72 is arranged upstream of the side roller 73 with respect to the direction of the movement of the adhesive tape 61. Accordingly, the adhesive tape 61 is guided first by the positioning roller 72 and then guided by the side roller 73.

The vertical position of the adhesive tape 61 is fixed by the positioning roller 72. In particular, the positioning roller 72 has a drum-like shape with a narrow middle portion. The adhesive tape 61 is guided by this narrow portion, so that positioning of the adhesive tape 61 in the vertical direction is achieved. The adhesive tape 61 that has passed the positioning roller 72 is pressed with a predetermined force by the side roller 73 against the bevel portion of the substrate W, whereby the adhesive tape 61 is stuck on the bevel portion of the substrate W.

Figure 32B:
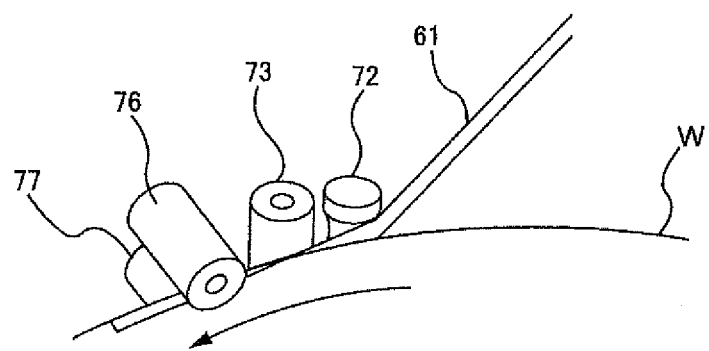

The side roller 73 is formed by an elastic material, such as urethane rubber. Therefore, when the side roller 73 presses the adhesive tape 61 with a predetermined force against the bevel portion of the substrate W, a circumferential surface of the side roller 73 is dented in conformity with the shape of the peripheral portion of the substrate W. Consequently, as shown in FIG. 32B, the entirety of the adhesive tape 61 is bent inwardly in the radial direction of the substrate W along the dented circumferential surface of the side roller 73.

As the substrate W rotates, the adhesive tape 61 reaches the first roller 76 and the second roller 77. The adhesive tape 61, which has been bent by the side roller 73, is nipped with a predetermined force by the first roller 76 and the second roller 77. As shown in FIGS. 32B and 33, the upper half of the adhesive tape 61 is bent by the first roller 76 along the longitudinal direction of the adhesive tape 61 and pressed against the edge portion of the substrate W. At the same time, the lower half of the adhesive tape 61 is bent by the second roller 77 along the longitudinal direction of the adhesive tape 61 and pressed against the back surface of the substrate W. The adhesive tape 61 is stuck on the peripheral portion of the substrate W in this manner. Further, by making one rotation of the substrate W, the adhesive tape 61 is stuck on the entire peripheral portion of the substrate W as shown in FIG. 32C.

Figure 32C:
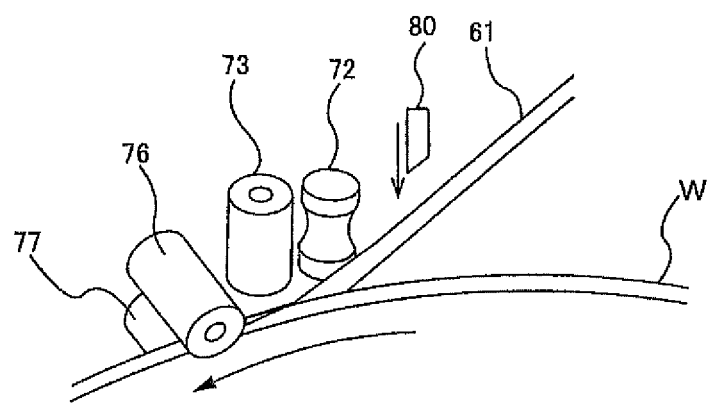
Figure 33:
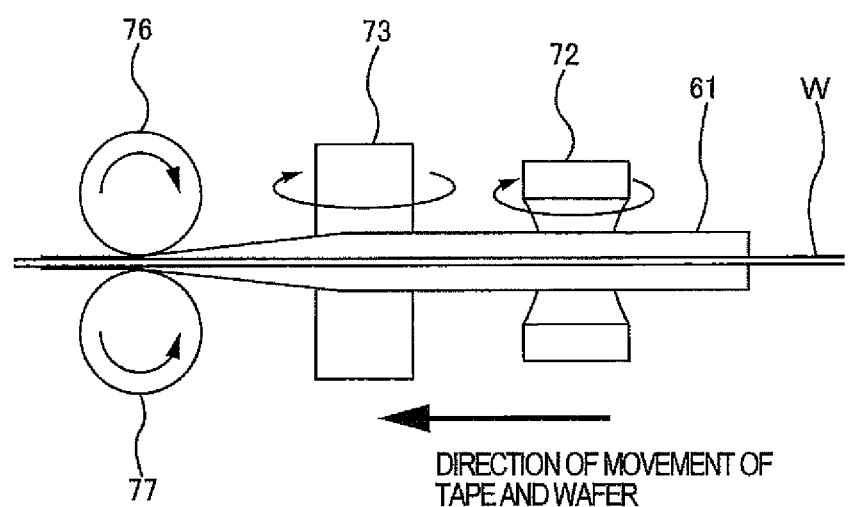
FIG. 33 is a perspective view showing the manner in which the adhesive tape is attached to the substrate.
Figure 34:
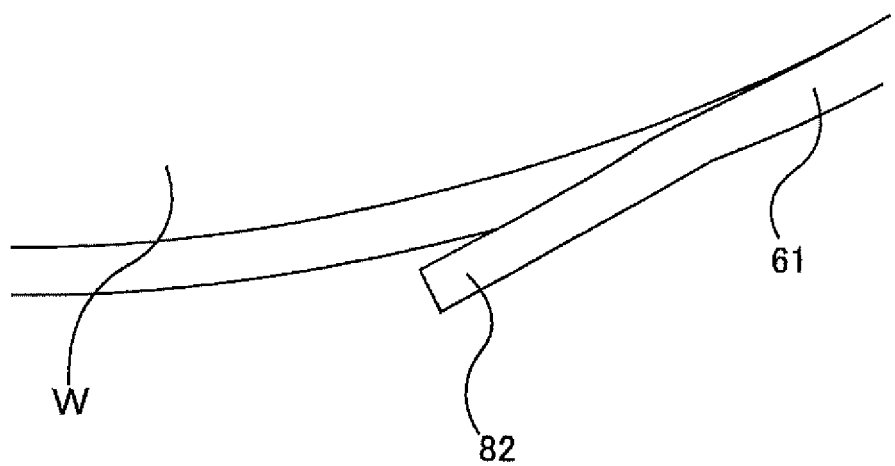
FIG. 34 is a view showing a terminal end of the adhesive protruding from the peripheral portion of the substrate.

After completion of the tape sticking process, the adhesive tape 61 is cut by a tape cutter 80 as shown in FIG. 32C. Before the adhesive tape 61 is cut, the positioning roller 72 and the side roller 73 are moved away from the substrate W to their retreat positions. The tape cutter 80 cuts the adhesive tape 61 at a position where the end of the adhesive tape 61 slightly projects from the peripheral portion of the substrate W. After the adhesive tape 61 is cut, the substrate W is rotated with the adhesive tape 61 interposed between the first roller 76 and the second roller 77, thereby forming a projecting end portion 82 which is the end portion of the adhesive tape 61 projecting from the peripheral portion of the substrate W, as shown in FIG. 34.

As shown in FIG. 30, the substrate processing apparatus further includes a tape peeling unit 90 for peeling off the adhesive tape 61. The tape peeling unit 90 will now be described in detail with reference to FIG. 35. The tape peeling unit 90 includes a chucking mechanism 93 for holding the projecting end portion 82 of the adhesive tape 61 and drawing the adhesive tape 61 from the substrate W. The chucking mechanism 93 has a pair of chucking members (e.g., chucking claws) 91, 91 for holding the projecting end portion 82 of the adhesive tape 61. The chucking mechanism 93 is configured to be capable of moving toward and away from the substrate W.

The tape peeling unit 90 further includes a pair of tape advancing rollers 95, 95 for peeling the adhesive tape 61 from the substrate W while advancing the adhesive tape 61 at a speed which is synchronous with the rotational speed of the substrate W, and a take-up roller 96 for winding thereon the adhesive tape 61 advanced from the tape advancing rollers 95, 95. One of the tape advancing rollers 95, 95 is coupled to a motor 97, and the take-up roller 96 is coupled to a motor 99. The rollers 95, 96 are rotated at predetermined speeds by these motors 97, 99.

Figure 35:
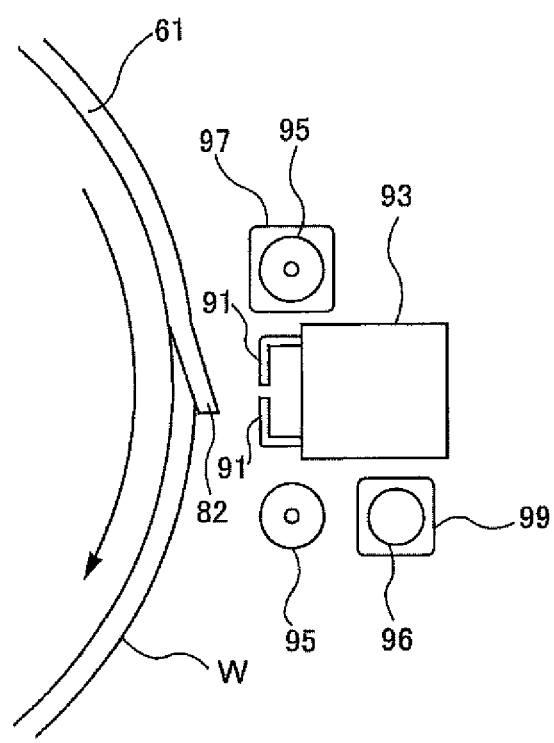
FIG. 35 is a schematic view showing a tape peeling unit.
Figure 36A:
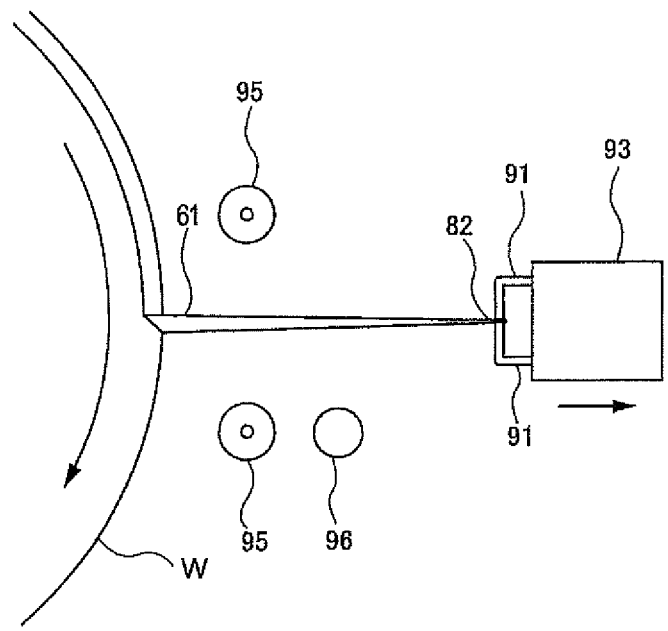
FIG. 36A and FIG. 36B are views each showing the manner in which the tape peeling unit peels the adhesive tape off the substrate.

The tape peeling unit 90 operates as follows. First, as shown in FIG. 35, the substrate W is rotated by the substrate stage 2 until the projecting end portion 82 comes to a position in front of the chucking mechanism 93. The chucking mechanism 93 moves toward the substrate W and holds the projecting end portion 82 with its chucking members 91, 91. Subsequently, as shown in FIG. 36A, the substrate W is rotated while the chucking mechanism 93, holding the projecting end portion 82 with the chucking members 91, 91, is moved backward. During this operation, the backward movement speed of the chucking mechanism 93 is synchronized with the rotational speed of the substrate W such that an angle between the adhesive tape 61 peeled from the substrate W and a tangential direction of the substrate W is 90°.

Figure 36B:
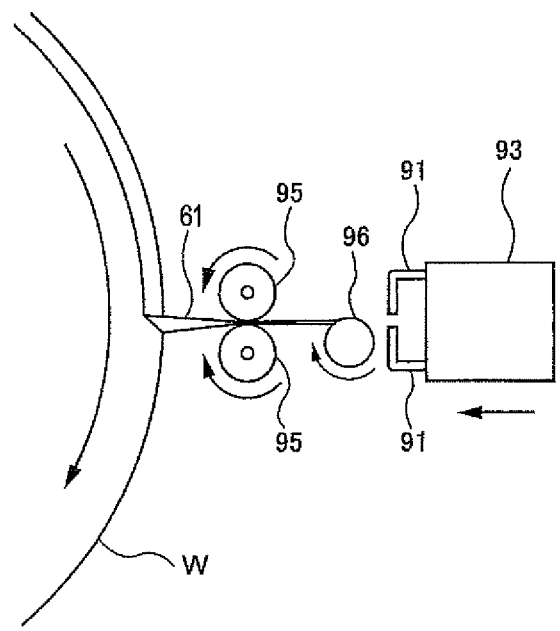

After the backward movement of the chucking mechanism 93 is terminated, the tape advancing rollers 95, 95 approach each other to nip the peeled adhesive tape 61 between them as shown in FIG. 36B. The take-up roller 96 is moved until it comes into contact with the peeled portion of the adhesive tape 61. The tape advancing rollers 95, 95 are then rotated to advance the peeled adhesive tape 61 to the take-up roller 96 at a predetermined speed. At the same time, the take-up roller 96 in contact with the adhesive tape 61 is rotated, whereby the peeled adhesive tape 61 is wound around the take-up roller 96.

Simultaneously with the start of winding the adhesive tape 61, the chucking mechanism 93 starts to move toward the take-up roller 96. When the adhesive tape 61 is wound around the take-up roller 96 to some extent, the chucking members 91, 91 release the projecting end portion 82, whereby the take-up roller 96 is allowed to continue winding of the adhesive tape 61 around itself. The tape advancing rollers 95, 95 rotate at a rotational speed which is synchronized with the rotational speed of the substrate W such that the angle between the adhesive tape 61 peeled from the substrate W and the tangential direction of the substrate W is 90°.

The take-up roller 96 and the tape advancing rollers 95, 95 continue rotating until the entirety of the adhesive tape 61 is peeled from the peripheral portion of the substrate W and is wound around the take-up roller 96. Though not shown in FIG. 36B, the tape advancing rollers 95, 95 and the take-up roller 96 are rotated by the motors 97, 99, respectively. After the winding of the adhesive tape 61 is terminated, the take-up roller 96 moves backward and the tape advancing rollers 95, 95 move in the directions away from each other.

Figure 37:
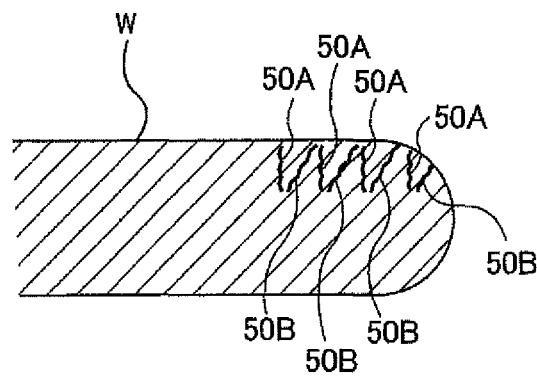
FIG. 37 is a cross-sectional view showing concentric annular cracks.

An embodiment of a method of processing a substrate using the substrate processing apparatus shown in FIGS. 30 and 36 will be described below with reference to FIGS. 37 through 39. As with the embodiment described previously, a plurality of concentric annular cracks that include a plurality of concentric first annular cracks 50A and a plurality of concentric second annular cracks 50B are formed in the peripheral portion of the substrate W, i.e., in the entirety of the edge portion and a part of the bevel portion of the substrate W, as shown in FIG. 37. The concentric annular cracks 50A, 50B are formed in the same steps as the previous embodiment described with reference to FIGS. 20 through 27.

Figure 38:
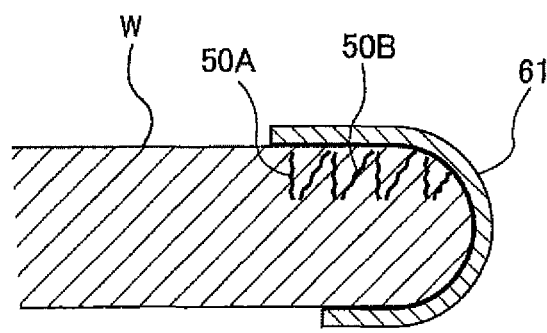
FIG. 38 is a view showing a process of attaching an adhesive tape to the entirety of the peripheral portion of the substrate.
Figure 39:
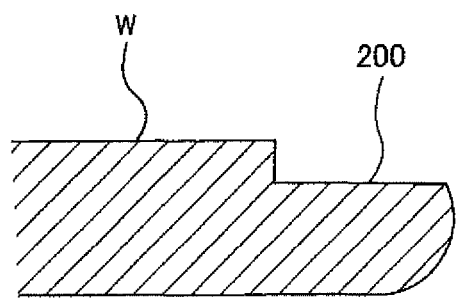
FIG. 39 is a view showing a process of peeling the adhesive tape off the peripheral portion of the substrate.

Then, as shown in FIG. 38, the tape sticking unit 58 attaches the adhesive tape 61 to the entirety of the peripheral portion of the substrate W which includes the edge portion and the bevel portion. The adhesive tape 61 is attached to the entire circumference of the substrate W. Then, as shown in FIG. 39, the tape peeling unit 90 peels the adhesive tape 61 off the peripheral portion of the substrate W, thereby removing the material of the substrate W, together with the adhesive tape 61, from the peripheral portion of the substrate W. As a result, a stepped recess 200 is formed in the peripheral portion of the substrate W.

The innermost first annular crack 50A also functions as the crack (or the scribe line) 50 in the embodiment shown in FIGS. 8 and 9. In other words, the innermost first annular crack 50A serves as a boundary of a stepped recess to be formed in the peripheral portion of the substrate W, so that the stepped recess can be formed highly accurately in the peripheral portion of the substrate W.

The substrate processing apparatus according to the present embodiment is not provided with the polishing head 30 described above. However, in one embodiment, the substrate processing apparatus may include the polishing head 30 in order to polish the recess that has been formed in the substrate W from which the material has been removed by the adhesive tape 61.

Figure 40:
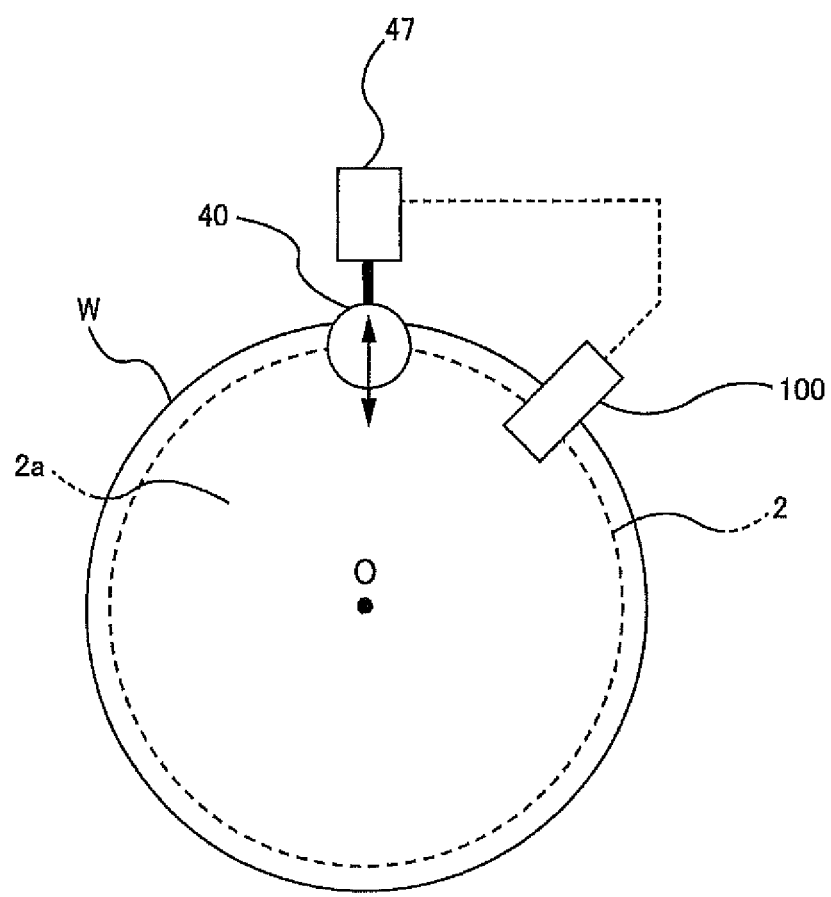
FIG. 40 is a plan view of an embodiment of a substrate processing apparatus which is provided with a position detector capable of detecting a position of an outermost contour of a substrate.

In each of the embodiments described above, the substrate processing apparatus may further include, as shown in FIG. 40, a position detector 100 for detecting a position of an outermost contour of the substrate W on the stage surface 2a. The position detector 100 is disposed above the substrate stage 2 and is directed toward the peripheral portion of the substrate W on the stage surface 2a. The position detector 100 is configured to detect the position of the outermost contour of the substrate W that is rotating, and send a detection signal indicative of the position of the outermost contour to the relatively-moving mechanism 47. When the substrate W is eccentric with the axis O of the substrate stage 2, the position of the outermost contour of the substrate W that is rotating varies. Therefore, the detection signal from the position detector 100 represents an amount of eccentricity of the substrate W with respect to the axis O of the substrate stage 2.

The relatively-moving mechanism 47 receives the detection signal from the position detector 100 and corrects the position of the laser head 40 on the basis of the position of the outermost contour of the substrate W. More specifically, the relatively-moving mechanism 47 moves the laser head 40 in a direction as to eliminate a change in a distance between the outermost contour of the substrate W and the laser head 40 when the substrate stage 2 is rotating. According to the present embodiment, the relatively-moving mechanism 47 moves the laser head 40 in the radial directions of the substrate W, as indicated by the arrows shown in FIG. 40, so that the distance between the outermost contour of the substrate W and the laser head 40 is kept constant.

According to the present embodiment, since the distance between the outermost contour of the substrate W and the incident position of the laser beam is kept constant, the laser head 40 can form an annular crack, which is concentric with the substrate W, in the peripheral portion of the substrate W. As a consequence, it is possible to form a stepped recess having a constant width in the peripheral portion of the substrate W.

The position detector 100 may comprise a known optical position detector or imaging position detector. For example, the position detector 100 may comprise an optical position detector having a light emitter and a light receiver which are located such that the peripheral portion of the substrate W is located between the light emitter and the light receiver. The optical position detector is configured to emit light from the light emitter toward the peripheral portion of the substrate W, receive the light by the light receiver, and determine the position of the outermost contour of the substrate W on the basis of the amount of light received by the light receiver. In another example, the position detector 100 may be an imaging position detector having an imaging sensor configured to generate an image of the peripheral portion of the substrate W and determine the position of the outermost contour of the substrate W by processing the image generated by the imaging sensor.

Figure 41:
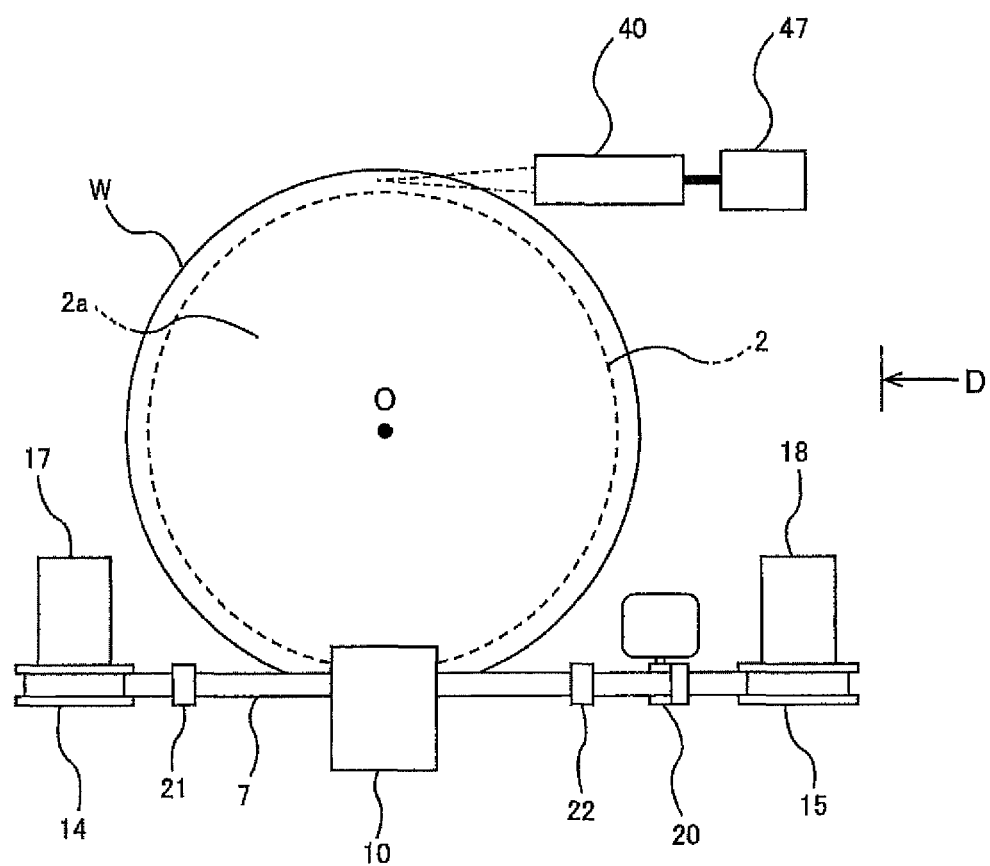
FIG. 41 is a plan view schematically showing a substrate processing apparatus according to an embodiment.
Figure 42:
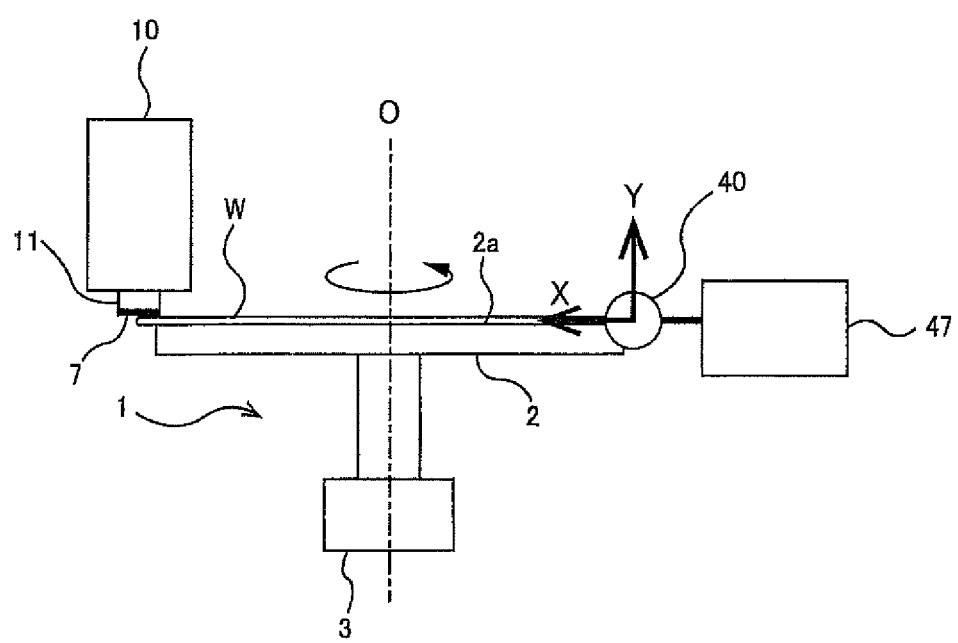
FIG. 42 is a side elevational view of the substrate processing apparatus shown in FIG. 41 as viewed from a direction indicated by an arrow D.

Another embodiment of the substrate processing apparatus will be described below with reference to FIGS. 41 and 42. Structural and operational details of this embodiment, which will not be described below in particular, are identical to those of the embodiment shown in FIGS. 2 through 4, and their repetitive descriptions will be omitted. The substrate processing apparatus according to the present embodiment includes laser head 40 disposed parallel to the stage surface 2a of the substrate stage 2. The laser head 40 is located at the same height as the stage surface 2a, so that the laser head 40 can irradiate the peripheral portion of the substrate W on the stage surface 2a with the laser beam which is parallel to the surface of the substrate W. As shown in FIG. 41, the laser beam travels in a tangential direction of the substrate W at an incident position of the laser beam.

Figure 43:
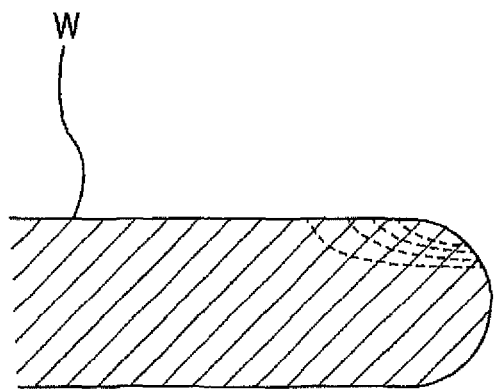
FIG. 43 is a schematic view showing the manner in which a material of a substrate is gradually removed by a laser beam.
Figure 44:
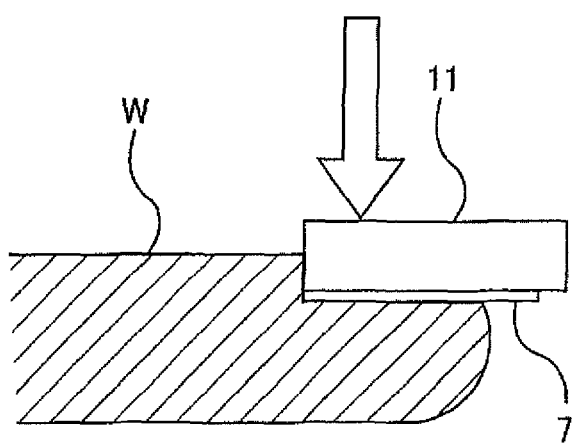
FIG. 44 is a view showing a process of causing a pressing member to press a polishing tape against a portion of the substrate from which the material has been removed.
Figure 45:
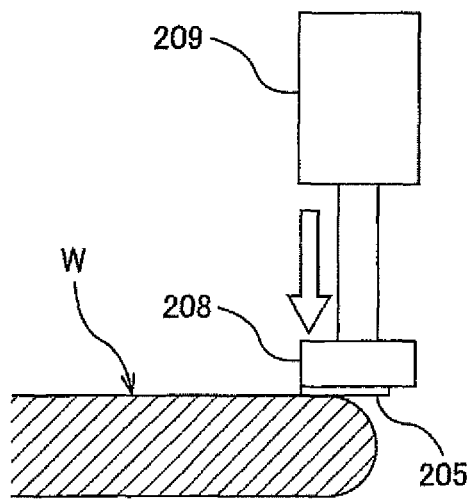
FIG. 45 is a schematic view showing a conventional polishing apparatus.
Figure 46:
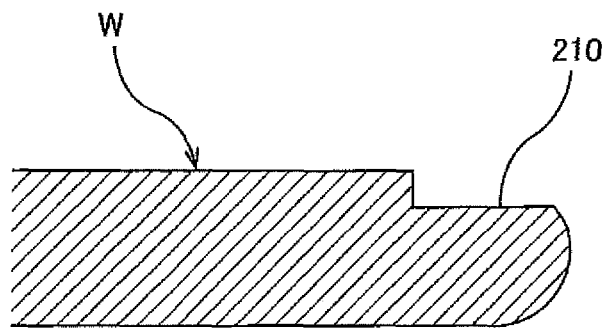
FIG. 46 is a cross-sectional view showing a stepped recess formed in a peripheral portion of a substrate.
Figure 47:
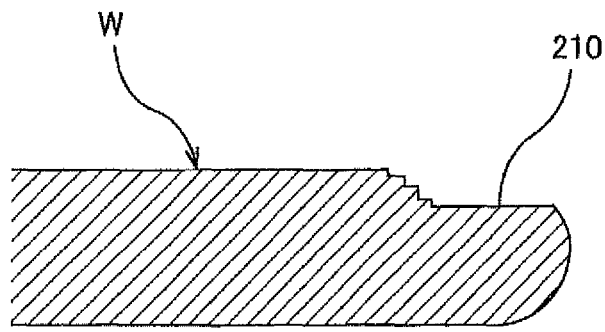
FIG. 47 is a cross-sectional view showing a stepped recess formed in a peripheral portion of a substrate.

An embodiment of a method of processing a substrate using the substrate processing apparatus shown in FIGS. 41 and 42 will be described below. The substrate W is placed on the stage surface 2a of the substrate stage 2 and held on the stage surface 2a. While the substrate stage 2 and the substrate W are being rotated about the axis O by the stage motor 3, the laser head 40 irradiates the peripheral portion of the substrate W with the laser beam that travels in the tangential direction of the substrate W. While the laser head 40 is directing the laser beam to the peripheral portion of the substrate W that is rotating, the relatively-moving mechanism 47 moves the laser beam inwardly in the radial direction of the substrate W relative to the substrate W. As a result, as shown in FIG. 43, the material of the substrate W is gradually removed from the outside of the peripheral portion by the laser beam.

When the processing of the substrate with the laser beam is terminated, the pressing member 11 presses the polishing tape 7 against the portion of the substrate W from which the material has been removed, while a liquid (e.g., pure water) is being supplied onto the surface (upper surface) of the substrate W, thus forming a stepped recess in the peripheral portion of the substrate W. In one embodiment, the polishing head 10 may not be provided, and a stepped recess may be formed in the peripheral portion of the substrate W by the laser beam only.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing method comprising:
   holding a substrate on a substrate stage;
   rotating the substrate stage and the substrate about an axis of the substrate stage;
   directing a laser beam to an edge portion of the rotating substrate to form an annular crack in the substrate; and
   pressing a polishing tool against the edge portion of the rotating substrate to form a stepped recess in a peripheral portion of the substrate.

2. The substrate processing method according to claim 1, wherein directing the laser beam to the edge portion of the rotating substrate to form the annular crack in the substrate comprises directing a laser beam to an edge portion of the rotating substrate in a direction perpendicular to a surface of the substrate to form an annular crack in the substrate.

3. The substrate processing method according to claim 1, wherein directing the laser beam to the edge portion of the rotating substrate to form the annular crack in the substrate comprises directing a laser beam to an edge portion of the rotating substrate in a direction inclined from a direction that is perpendicular to a surface of the substrate to form an annular crack in the substrate.

4. A substrate processing method comprising:
   holding a substrate on a substrate stage;
   rotating the substrate stage and the substrate about an axis of the substrate stage;
   repeating a first irradiation process of directing a laser beam to a peripheral portion of the rotating substrate and a second irradiation process of directing a laser beam to the peripheral portion of the rotating substrate at an angle different from an angle of the laser beam in the first irradiation process, thereby forming a plurality of concentric annular cracks in the peripheral portion of the substrate; and
   removing a material of the substrate from the peripheral portion of the substrate to form a stepped recess in the peripheral portion of the substrate.

5. The substrate processing method according to claim 4, wherein removing the material of the substrate from the peripheral portion of the substrate comprises pressing a polishing tool against the peripheral portion of the substrate to polish the peripheral portion.

6. The substrate processing method according to claim 4, wherein removing the material of the substrate from the peripheral portion of the substrate comprises attaching an adhesive tape to an entirety of the peripheral portion of the substrate and peeling the adhesive tape off the peripheral portion of the substrate to remove a material of the substrate together with the adhesive tape.

7. The substrate processing method according to claim 4, wherein the first irradiation process and the second irradiation process are repeated alternately.

8. A substrate processing method comprising:
   holding a substrate on a substrate stage;
   rotating the substrate stage and the substrate about an axis of the substrate stage; and
   directing a laser beam to the rotating substrate in a tangential direction of the substrate to remove a material of the substrate from a peripheral portion of the substrate, the laser beam being parallel to a flat surface of the substrate.

9. A substrate processing method comprising:
   holding a substrate on a substrate stage;
   rotating the substrate stage and the substrate about an axis of the substrate stage; and
   directing a laser beam to the rotating substrate in a tangential direction of the substrate to remove a material of the substrate from a peripheral portion of the substrate,
   wherein the laser beam is moved inwardly in a radial direction of the substrate relative to the substrate while the laser beam is being directed to the substrate.

10. A substrate processing method comprising:
   holding a substrate on a substrate stage;
   rotating the substrate stage and the substrate about an axis of the substrate stage;
   directing a laser beam to the rotating substrate in a tangential direction of the substrate to remove a material of the substrate from a peripheral portion of the substrate; and
   pressing a polishing tool against a portion of the substrate from which the material has been removed.

11. A substrate processing method comprising:
   holding a substrate on a substrate stage;
   rotating the substrate stage and the substrate about an axis of the substrate stage;
   directing a laser beam to an edge portion of the rotating substrate to form multiple annular cracks in the substrate;
   attaching an adhesive tape to an entirety of a peripheral portion of the substrate; and
   peeling the adhesive tape off the peripheral portion of the substrate to remove a material of the substrate together with the adhesive tape, thereby forming a stepped recess in the peripheral portion of the substrate.

* * * * *